(12) United States Patent
Yano

(10) Patent No.: US 11,700,699 B2
(45) Date of Patent: Jul. 11, 2023

(54) VENTILATION MEMBER

(71) Applicant: NITTO DENKO CORPORATION, Ibaraki (JP)

(72) Inventor: Youzou Yano, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 929 days.

(21) Appl. No.: 16/329,607

(22) PCT Filed: May 26, 2017

(86) PCT No.: PCT/JP2017/019741
§ 371 (c)(1),
(2) Date: Feb. 28, 2019

(87) PCT Pub. No.: WO2018/042782
PCT Pub. Date: Mar. 8, 2018

(65) Prior Publication Data
US 2019/0219246 A1    Jul. 18, 2019

(30) Foreign Application Priority Data

Aug. 30, 2016 (JP) ................................. 2016-168486

(51) Int. Cl.
*H05K 5/02* (2006.01)
*F21S 45/30* (2018.01)
*F21V 31/03* (2006.01)

(52) U.S. Cl.
CPC ......... *H05K 5/0216* (2022.08); *H05K 5/0214* (2022.08); *F21S 45/30* (2018.01); *F21V 31/03* (2013.01)

(58) Field of Classification Search
USPC ........................ 454/333, 340, 255; 362/547
See application file for complete search history.

(56) References Cited

U.S. PATENT DOCUMENTS

| | | | | |
|---|---|---|---|---|
| 5,209,992 A | * | 5/1993 | Feres ................... | H01M 50/308 |
| | | | | 429/89 |
| 5,348,570 A | * | 9/1994 | Ruppert, Jr. .......... | F16H 57/027 |
| | | | | 55/504 |

(Continued)

FOREIGN PATENT DOCUMENTS

| | | | | |
|---|---|---|---|---|
| DE | 102011086108 A1 | * | 5/2013 | ........... H05K 5/0213 |
| EP | 2269874 A1 | | 1/2011 | |

(Continued)

OTHER PUBLICATIONS

Aug. 8, 2017 International Search Report issued in International Patent Application PCT/JP2017/019741.

(Continued)

*Primary Examiner* — Edelmira Bosques
*Assistant Examiner* — Frances F. Hamilton
(74) *Attorney, Agent, or Firm* — Oliff PLC

(57) ABSTRACT

A ventilation member is attached to a through hole of a housing. The ventilation member includes: a support body in which a ventilation path that forms a flow path for gas between the interior and the exterior of the housing; a sealing member that seals between the support body and the housing; a ventilation membrane that is provided on the ventilation path to prevent a liquid and a solid from passing through and to allow gas to pass through; and a surrounding portion that is provided to the support body and is formed with a uniform height to surround an end portion opening of the ventilation path.

9 Claims, 10 Drawing Sheets

(56) References Cited

U.S. PATENT DOCUMENTS

| | | | | |
|---|---|---|---|---|
| 5,353,949 | A * | 10/1994 | Seibert | B01D 46/0094 220/372 |
| 5,522,769 | A * | 6/1996 | DeGuiseppi | F21S 45/33 454/270 |
| 5,775,794 | A * | 7/1998 | Schmitt | B60Q 1/0683 362/294 |
| 5,785,390 | A * | 7/1998 | Gold | B60B 7/00 301/108.4 |
| 5,914,415 | A * | 6/1999 | Tago | B01D 19/0031 96/13 |
| 6,056,439 | A * | 5/2000 | Graham | B65D 77/225 383/103 |
| 6,210,014 | B1 * | 4/2001 | Kubizne | F21S 45/37 362/546 |
| 6,364,924 | B1 * | 4/2002 | Mashiko | F21S 45/37 96/13 |
| 6,468,332 | B2 * | 10/2002 | Goglio | B65D 77/225 220/372 |
| 6,521,024 | B1 * | 2/2003 | Akahori | H01M 50/3425 96/6 |
| 6,524,361 | B1 * | 2/2003 | Thornton | F21S 9/022 55/495 |
| 6,883,948 | B2 * | 4/2005 | VanDuyn | F21S 45/33 362/267 |
| 7,357,709 | B2 * | 4/2008 | Zukor | G03B 17/02 454/270 |
| 8,684,568 | B2 * | 4/2014 | Nagaoka | F21V 31/005 362/249.02 |
| 8,715,382 | B2 * | 5/2014 | Furuyama | H05K 5/0213 55/504 |
| 8,821,226 | B2 * | 9/2014 | Yano | B65D 77/225 454/162 |
| 8,828,125 | B2 * | 9/2014 | Furuuchi | H05K 5/0213 362/547 |
| 8,980,455 | B2 * | 3/2015 | Guo | H01M 50/333 429/53 |
| 8,999,486 | B2 * | 4/2015 | Kamikawa | B32B 3/263 428/167 |
| 9,168,489 | B2 * | 10/2015 | Furuyama | B01D 46/2414 |
| 9,295,949 | B2 * | 3/2016 | Uemura | H02K 5/10 |
| 9,303,839 | B2 * | 4/2016 | Scagliarini | F21S 45/30 |
| 9,428,304 | B2 * | 8/2016 | Scagliarini | B65D 25/20 |
| 9,535,176 | B2 * | 1/2017 | Miyoshi | G01T 7/00 |
| 9,605,869 | B2 * | 3/2017 | Bailey | F24F 7/065 |
| 9,616,618 | B2 * | 4/2017 | Furuyama | B29C 66/53461 |
| 10,875,443 | B2 * | 12/2020 | Mattina | B60Q 1/007 |
| 2002/0090506 | A1 * | 7/2002 | Protzner | H05K 5/0213 428/461 |
| 2003/0216119 | A1 * | 11/2003 | Mashiko | H01R 13/5227 454/275 |
| 2006/0113236 | A1 * | 6/2006 | Dahlgren | B01D 46/0039 210/237 |
| 2009/0047890 | A1 * | 2/2009 | Yano | F21S 45/30 454/270 |
| 2009/0268475 | A1 * | 10/2009 | Ball | F21V 29/83 454/238 |
| 2011/0016836 | A1 * | 1/2011 | Yano | F21V 31/03 55/491 |
| 2011/0261578 | A1 * | 10/2011 | Kudelka | F21S 45/33 362/547 |
| 2012/0207970 | A1 * | 8/2012 | Kamikawa | B32B 3/263 428/137 |
| 2013/0012117 | A1 * | 1/2013 | Uemura | B29C 66/5412 454/275 |
| 2014/0318374 | A1 * | 10/2014 | Yano | B01D 53/22 96/11 |
| 2015/0293239 | A1 * | 10/2015 | Miyoshi | G01T 7/00 250/394 |
| 2015/0323151 | A1 * | 11/2015 | Hansmann | F21S 45/30 362/547 |
| 2015/0334863 | A1 * | 11/2015 | Beer | H05K 5/0213 220/745 |
| 2016/0377255 | A1 * | 12/2016 | Schubert | F21S 45/33 362/547 |
| 2017/0132954 | A1 * | 5/2017 | Birk | B32B 38/10 |

FOREIGN PATENT DOCUMENTS

| | | |
|---|---|---|
| EP | 2787277 A1 | 10/2014 |
| FR | 3012938 A1 | 5/2015 |
| JP | 2007-141629 A | 6/2007 |
| JP | 2009-252508 A | 10/2009 |
| JP | 2011-198615 A | 10/2011 |
| JP | 2013-114829 A | 6/2013 |
| JP | 2015-206781 A | 11/2015 |
| WO | 2015067888 A1 | 5/2015 |

OTHER PUBLICATIONS

Feb. 26, 2020 Extended European Search Report issued in European Patent Application No. 17845793.3.

\* cited by examiner

VENTILATION MEMBER

TECHNICAL FIELD

The present invention relates to a ventilation member and an inspection method.

BACKGROUND ART

For example, in a vehicle lamp or the like, a housing is provided with a through hole for the purpose of preventing deformation and breakage of the housing due to a temperature difference between the interior and the exterior of the housing. To the through hole, a ventilation member for preventing entry of water or dust into the housing is attached in some cases.

For example, a ventilation member described in Patent Document 1 includes a support body provided with a through hole, a ventilation membrane closing the through hole in the support body, and a cover part covering the ventilation membrane. In the ventilation member described in Patent Document 1, a ventilation hole is made in a ceiling portion of the cover part and a notch is made in a side wall portion thereof. These ventilation hole and notch function as a ventilation path between the interior and the exterior of the cover part. The ventilation hole establishes a positional relation that it does not overlap a ventilation region of the ventilation membrane in an axial direction. Further, the side wall portion of the cover part extends to a lower side in the axial direction below a position at which the ventilation membrane is disposed, and the ventilation membrane is protected entirely along a circumferential direction by the side wall portion. The ventilation membrane is disposed on a mesa-like portion that is convex to an upper side in the axial direction.

CITATION LIST

Patent Literature

Patent Document 1: Japanese Patent Application Laid-Open Publication No. 2007-141629

SUMMARY OF INVENTION

Technical Problem

By the way, when the ventilation member is attached to the housing, a sealing portion that seals between the ventilation member and the housing is provided. Then, in performing investigation of sealing characteristics in the sealing portion, it is necessary to perform the investigation upon stopping flow of gas through the ventilation path of the ventilation member. In this case, it is preferable that the ventilation path of the ventilation member can be easily closed.

An object of the present invention is to provide a ventilation member capable of easily closing a ventilation path.

Solution to Problem

Under such an object, the present invention is a ventilation member to be attached to a through hole of a housing, the ventilation member including: a main body unit provided with a ventilation path that forms a flow path for gas between an interior and an exterior of the housing; a sealing unit that seals between the main body unit and the housing; a ventilation membrane unit provided on the ventilation path to prevent passage of a liquid and a solid and to allow passage of gas; and a surrounding unit that is provided in the main body unit and surrounds an end portion opening of the ventilation path having a height uniformly formed.

The surrounding unit is protruded out of the end portion opening of the main body unit.

Here, the main body unit includes a reduction unit that reduces load applied to the sealing unit when the end portion opening is closed.

Further, the end portion opening opens while facing toward an intersecting direction that intersects an attachment surface in the housing for attaching the ventilation member.

Alternatively, the end portion opening opens while facing toward a direction along an attachment surface in the housing for attaching the ventilation member.

The sealing unit includes an opening portion inside thereof, and at least a part of the ventilation membrane unit is provided inside the opening portion of the sealing unit.

Moreover, the ventilation membrane unit is disposed within a range of a width region of the sealing unit in an intersecting direction that intersects an attachment surface of the housing for attaching the ventilation member.

Further, the sealing unit is disposed within a range of a width region of the main body unit in an intersecting direction that intersects an attachment surface of the housing for the ventilation member.

Under such an object, the present invention is an inspection method of a ventilation member including a ventilation membrane unit provided on a ventilation path formed in a main body unit, the ventilation membrane unit preventing passage of a liquid and a solid and allowing passage of gas, the inspection method including: an attachment step which attaches the main body unit to a through hole of a housing with a sealing unit being interposed therebetween; a placement step which places a jig having hardness lower than that of the sealing unit and suppressing flow of gas via the ventilation path in the main body unit; and a filling step which fills an interior of the housing with gas.

Advantageous Effects of Invention

According to the present invention, it is possible to provide a ventilation member capable of easily closing a ventilation path.

DESCRIPTION OF EMBODIMENTS

Hereinafter, exemplary embodiments according to the present invention will be described in detail with reference to attached drawings.

First Exemplary Embodiment

Figure 1:
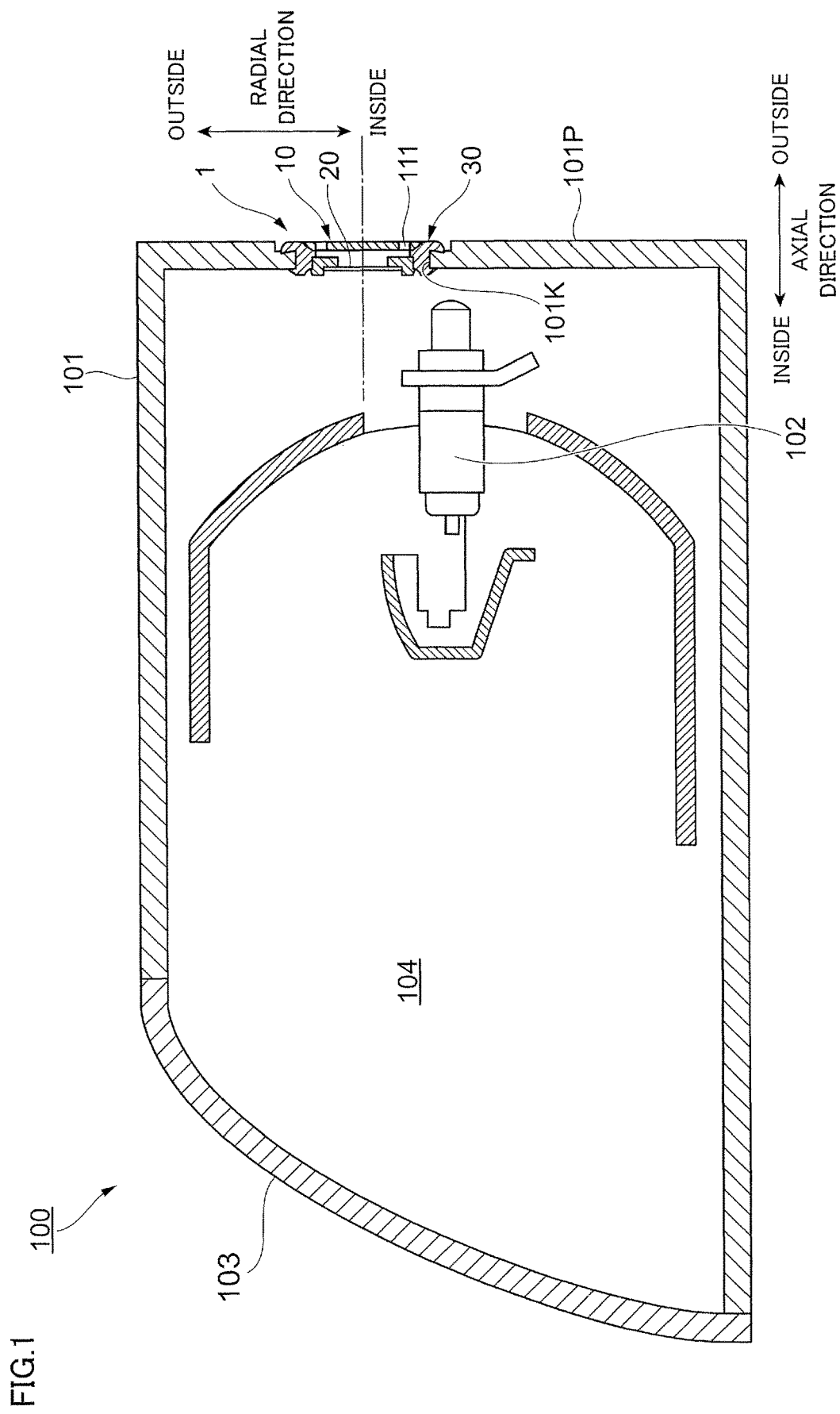
FIG. 1 is a diagram showing an overall configuration of a vehicle lamp of exemplary embodiments.

FIG. 1 is a diagram showing an overall configuration of a vehicle lamp 100 of the exemplary embodiments.

As shown in FIG. 1, the vehicle lamp 100 includes: a device housing 101 that protects electrical components or other components of a vehicle; a bulb 102, which is one of the electrical components and emits light; and a lens 103 attached to the device housing 101.

The vehicle lamp 100 of the exemplary embodiment constitutes a closed housing interior (lamp housing interior) 104 of the vehicle lamp 100 by the device housing 101 and the lens 103. The vehicle lamp 100 increases waterproofing properties and dust-proofing properties for each electrical component in the housing interior 104. However, the housing interior 104 is not in a complete sealed state, and ventilation can be carried out via a through hole 101K.

The vehicle lamp 100 of the exemplary embodiment includes a ventilation member 1 capable of transferring air between the interior and exterior of the lamp.

Note that, in the following description, a direction along a direction orthogonal to an attachment surface 101P on which the through hole 101K is formed in the device housing 101 (a depth direction of the through hole 101K) is assumed to be "axial direction". Moreover, in the axial direction, the side corresponding to the housing interior 104 is assumed to be "inside in the axial direction", and the side corresponding to the exterior of the device housing 101 is assumed to be "outside in the axial direction". Moreover, a direction extending in a radiation direction from the center of the ventilation member 1 shown in FIG. 1 is assumed to be "radial direction". Then, in the radial direction, the center side of the ventilation member 1 is assumed to be "inside in the radial direction", and the side moving away from the center side is assumed to be "outside in the radial direction".

Then, the ventilation member 1 is inserted into the through hole 101K of the attachment surface 101P. In the vehicle lamp 100 of the exemplary embodiment, the attachment surface 101P is a surface rising substantially along the vertical direction. Consequently, an end portion opening 111, which will be described later, of the ventilation member 1 opens substantially in the horizontal direction. Therefore, in the vehicle lamp 100 of the exemplary embodiment, a liquid is less likely to enter the ventilation member 1, whereas a liquid entered the ventilation member 1 is more likely to flow out thereof.

Note that the ventilation member 1 can be mounted on the device housing 101 of, not limited to the vehicle lamp 100 shown in FIG. 1, an inverter, a converter, an ECU (electronic control unit), a battery box, a millimeter-wave radar, a dashboard camera or the like. In other words, the ventilation member 1 is attached to a housing that requires elimination of differential pressure occurring inside the housing due to temperature change.

[Configuration and Function of Ventilation Member 1]

Figure 2A:
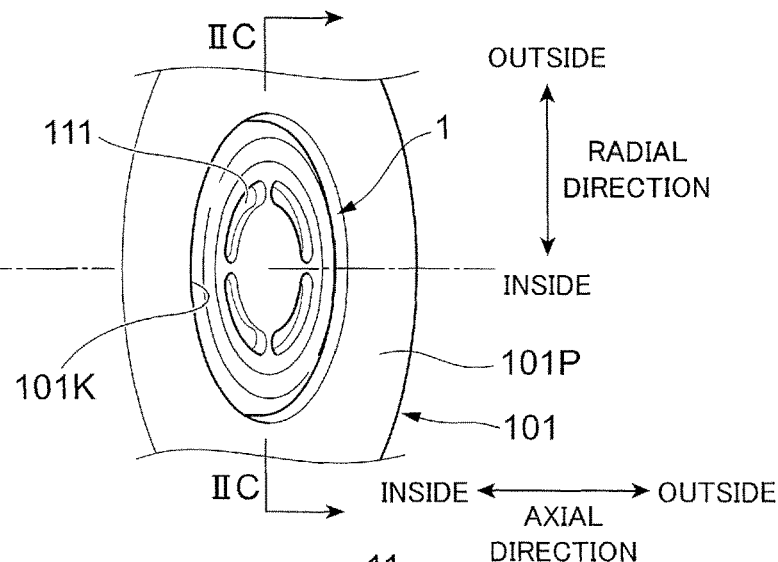
FIGS. 2A, 2B and 2C are illustration diagrams of a ventilation member of a first exemplary embodiment.
Figure 2B:
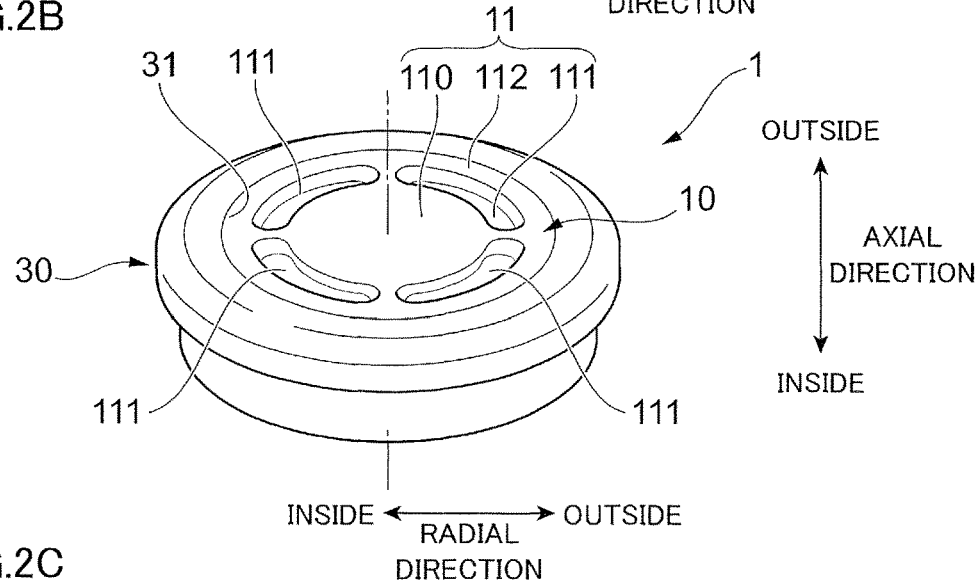
Figure 2C:
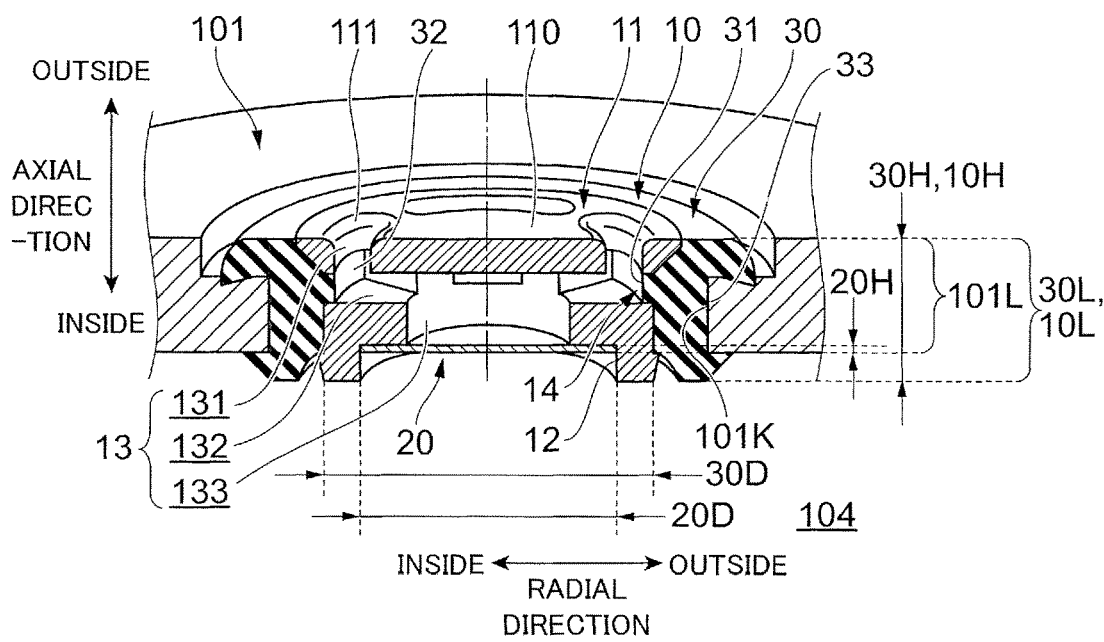

FIGS. 2A to 2C are illustration diagrams of the ventilation member 1 of the first exemplary embodiment.

Note that FIG. 2A shows the ventilation member 1 in the state of being attached to the device housing 101. FIG. 2B is an overall perspective view of the ventilation member 1. FIG. 2C is a perspective cross-sectional view of the ventilation member 1 shown in FIG. 2A along the IIC-IIC cross-sectional line. In other words, FIG. 2C shows a cross section of the ventilation member 1 cut along the axial direction and viewed from the radial direction.

As shown in FIGS. 2B and 2C, the ventilation member 1 (an example of a main body unit) includes: a support body 10; a ventilation membrane 20 (an example of a ventilation membrane unit) supported by the support body 10; and a sealing member 30 (an example of a sealing unit) provided between the support body 10 and the device housing 101.
(Support Body 10)

As shown in FIG. 2C, the support body 10 includes: an outside end portion 11 provided on the outside in the axial direction; a ventilation membrane holding portion 12 provided on the inside in the axial direction; a ventilation path 13 forming a path for gas between the interior and exterior of the device housing 101; and a sealing member holding portion 14 provided on the inside in the axial direction.

As shown in FIG. 2B, the outside end portion 11 faces toward the outside of the device housing 101. Then, the outside end portion 11 includes: a center end portion 110 provided on the inside in the radial direction of the outside end portion 11; end portion openings 111 provided on the outside in the radial direction of the end portion opening 110; and a contacted portion 112 provided on the outside in the radial direction of the end portion openings 111.

As shown in FIG. 2B, the center end portion 110 is formed into substantially a disk-like shape. Moreover, as shown in FIG. 2C, an outer diameter of the center end portion 110 is formed larger than an inner diameter of a third ventilation path portion 133, which will be described later. Then, the center end portion 110 is provided to a position facing the third ventilation path portion 133.

As shown in FIG. 2B, the plural end portion openings 111 (in the first exemplary embodiment, four) are provided. The end portion opening 111 forms a termination on the outside in the axial direction of a first ventilation path portion 131, which will be described later. Moreover, each of the end portion openings 111 is formed into substantially an arc shape. Then, the plural end portion openings 111 are arranged in line at predetermined intervals in the circumferential direction of the outside end portion 11.

In the first exemplary embodiment, as shown in FIG. 2A, the end portion opening 111 opens toward an orthogonal direction that is orthogonal to the attachment surface 101P of the device housing 101.

As shown in FIG. 2B, the contacted portion 112 (an example of a surrounding unit) is, in the first exemplary embodiment, formed to have the same height as the center end portion 110. The contacted portion 112 is formed to surround all of the plural end portion openings 111. Moreover, in the first exemplary embodiment, the contacted portion 112 is a location in which protrusion height thereof in the axial direction is uniformly formed. In other words, the contacted portion 112 forms a surface into substantially an annular shape in the outside end portion 11.

Then, the contacted portion 112 forms a location with which an investigation jig is in contact when a sealing characteristics investigation, which will be described later, is performed.

As shown in FIG. 2C, the ventilation membrane holding portion 12 is provided to face the housing interior 104. The ventilation membrane holding portion 12 is formed into substantially a cylindrical shape. Then, the ventilation membrane holding portion 12 forms a location to which the ventilation membrane 20 is attached.

The ventilation path 13 includes, from the outside in the axial direction toward the inside in the axial direction, the first ventilation path portion 131, the second ventilation path portion 132 and the third ventilation path portion 133.

The first ventilation path portion 131 is formed into substantially an arc shape. Then, the first ventilation path portion 131 forms a path for gas extending in the axial direction. Moreover, the first ventilation path portion 131 is connected to the end portion opening 111 on the outside in the axial direction. The second ventilation path portion 132 forms a path for gas extending in the radial direction. The third ventilation path portion 133 is formed into substantially a cylindrical shape. Then, the third ventilation path portion 133 forms a path for gas extending in the axial direction. Moreover, the third ventilation path portion 133 faces the ventilation membrane 20 on the inside in the axial direction.

Then, as shown in FIG. 2C, in the ventilation member 1, there is provided the center end portion 110, the outer diameter of which is larger than the inner diameter of the third ventilation path portion 133 facing the ventilation membrane 20. Moreover, the ventilation member 1 is provided with the ventilation path 13 formed to extend in the axial direction and the radial direction. Accordingly, even when the inside of the ventilation member 1 is seen through the end portion opening 111, the ventilation membrane 20 cannot be seen. Then, in the ventilation member 1, for example, even when flying debris or the like falls into the end portion openings 111, damage of the ventilation membrane 20 is suppressed by preventing the flying debris or the like from directly hitting the ventilation membrane 20.

As shown in FIG. 2C, the sealing member holding portion 14 is an annular-shaped groove recessed toward the inside in the radial direction. The sealing member holding portion 14 forms a portion in which the sealing member 30 is engaged. The sealing member holding portion 14 prevents the support body 10 from detaching from the sealing member 30 even when a force in the axial direction is applied to the support body 10.

The support body 10 can be prepared by a general molding method, such as injection molding, compression molding or cutting. Moreover, as a material of the support body 10, it is preferable to use thermoplastic resin in terms of molding characteristics of the support body 10 itself or in terms of the fact that the thermoplastic resin is preferable when the ventilation membrane 20 is attached by welding. Specifically, as the material of the support body 10, the thermoplastic resin, such as PA (nylon), PET (polyethylene terephthalate), PPS (polyphenylene sulfide), PBT (polybutylene terephthalate), PC (polycarbonate), PPE (polyphenylene ether) or elastomer, can be used. Moreover, as the material of the support body 10, metal or thermosetting resin, such as NBR (nitrile-butadiene rubber), EDPM (ethylene propylene diene rubber), silicone rubber, fluororubber, acrylic rubber or nitrile-butadiene rubber hydride may be used.

(Ventilation Membrane 20)

The ventilation membrane 20 is formed in a disk shape. The ventilation membrane 20 is a membrane in which plural holes that allow passage of gas and prevent passage of a liquid are formed. Examples of the liquid entry of which is prevented by the ventilation membrane 20 can include water, salt water, muddy water and washing water. Then, the ventilation membrane 20 is fastened to the above-described ventilation membrane holding portion 12. Note that, for fastening the ventilation membrane 20, when the support body 10 is made of the thermoplastic resin, thermal welding, such as iron welding, ultrasonic welding or laser welding, can be used. Moreover, the ventilation membrane 20 may be, for example, placed in a mold and fastened by insert molding that casts resin for constituting the support body 10.

The ventilation membrane 20 of the first exemplary embodiment employs a resin porous membrane provided with a laminated reinforcing layer. In this case, as the material of the resin porous membrane, it is possible to use a fluorine resin porous body or a polyolefine porous body that can be manufactured by a known stretching method or extraction method. As the fluorine resin, examples can include: PTFE (polytetrafluoroethylene); polychlorotrifluoroethylene; tetrafluoroethylene-hexafluoropropylene copolymer; tetrafluoroethylene-hexafluoropropylene copolymer; and tetrafluoroethylene-ethylene copolymer. As monomers constituting polyolefine, examples can include: ethylene; propylene; 4-methylpentene-1; and 1-butene, and polyolefine obtained by homopolymerizing or copolymerizing these monomers can be used. Moreover, as the material of the resin porous membrane, a nanofiber film porous body or the like using polyacrylonitrile, nylon or polylactic acid may be used. Especially, as the material, it is preferable to use a PTFE porous body that secures a ventilating property with a small area and is highly functional to prevent entry of foreign materials into the housing interior.

Note that the resin porous membrane may be subjected to liquid repellent treatment depending on intended use of the device housing 101.

Further, the ventilation membrane 20 of the first exemplary embodiment is subjected to oil repellent treatment. The liquid repellent treatment can be performed by coating the surface of the ventilation membrane 20 with a liquid repellent agent, which has, for example, a compound including a hydrocarbon group saturated with fluoride (perfluoro-alkyl group) in a side chain and has a main chain of acrylic series, methacrylic series, silicone series or the like as a component. The method of coating the surface of the ventilation membrane 20 is not particularly limited; however, for example, gravure coating, spray coating, kiss coating, dipping or the like can be adopted. Moreover, as the oil repellent treatment, the method thereof is not particularly limited as long as oil repellent coating containing polymer having perfluoro-alkyl group can be formed. As the forming method, examples can include coating of solution or dispersion of polymer having perfluoro-alkyl group by an air spray method, an electrostatic spray method, a dip coating method, a spin coating method, a roll coating method, a curtain flow coating method, an impregnation method or the like, or coating formation method or the like by an electrodeposition coating method or a plasma polymerization method.

Alternatively, the oil repellent treatment may be applied to the support body 10, not limited to the ventilation membrane 20.

Note that the ventilation membrane 20 is not limited to the above-described example as long as the ventilation membrane 20 allows passage of gas and prevents passage of a liquid. As the ventilation membrane 20, various kinds of materials or structures, for example, a woven cloth, a non-woven cloth, a mesh, a net, a sponge, a porous body or the like made of resin or metal may be used.

(Sealing Member 30)

As shown in FIG. 2B, the sealing member 30 is an elastic member having substantially an annular shape with an opening portion 31 on the inside in the radial direction. Then, as shown in FIG. 2C, the sealing member 30 is provided on the outside in the radial direction of the support body 10 and on the inside in the radial direction of the through hole 101K of the device housing 101, to thereby seal between the device housing 101 and the support body 10.

Moreover, as shown in FIG. 2C, the sealing member 30 includes a support member facing portion 32 on the inside in the radial direction and a housing facing portion 33 on the outside in the radial direction.

The support member facing portion 32 has a shape fitting into the sealing member holding portion 14. Moreover, in the first exemplary embodiment, the support member facing portion 32 forms, together with the support body 10, a part of the path through which gas flows.

The housing facing portion 33 has a cross section formed into a U shape. Then, the housing facing portion 33 is connected to the device housing 101 by enclosing the through hole 101K from the outside in the axial direction, the side portion and the inside in the axial direction. This makes the sealing member 30 hard to detach from the device housing 101.

As a material of the sealing member 30, various kinds of elastic bodies, such as elastomer and the like including: silicone rubber; NBR (nitrile-butadiene rubber); EDPM (ethylene propylene diene methylene); fluororubber; acrylic rubber; and nitrile-butadiene rubber hydride, foam, foam with an adhesive layer, may be used.

Subsequently, detailed description will be given of relationship between sizes and positions of the components in the ventilation member 1 in the first exemplary embodiment.

As shown in FIG. 2C, the width of the support body 10 in the axial direction is referred to as a support body width 10H. The width of the ventilation membrane 20 in the axial direction is referred to as a ventilation membrane width 20H. The width of the sealing member 30 in the axial direction is referred to as a sealing member width 30H.

In the first exemplary embodiment, the support body width 10H and the sealing member width 30H are substantially the same. The ventilation membrane width 20H is formed thinner than the support body width 10H and the sealing member width 30H.

Moreover, in the cross section of the ventilation member 1 in FIG. 2C, a region which the support body 10 occupies in the axial direction is referred to as a support body width region 10L. Moreover, a region which the sealing member 30 occupies in the axial direction is referred to as a sealing member width region 30L.

In the first exemplary embodiment, the ventilation membrane 20 is disposed within the range of the support body width region 10L in the axial direction. Further, the ventilation membrane 20 is disposed within the range of the sealing member width region 30L in the axial direction.

Further, as shown in FIG. 2C, the outer diameter (the outer shape) 20D of the ventilation membrane 20 is smaller than the inner diameter (the inner shape) 30D of the opening portion 31 in the sealing member 30.

Then, in the ventilation member 1, the ventilation membrane 20 is provided on the inside of the opening portion 31 of the sealing member 30 in the axial direction and the radial direction.

As described above, in the ventilation member 1, the support body 10, the ventilation membrane 20 and the sealing member 30 are arranged to be in line in the radial direction. Then, in the ventilation member 1, at least a part of each of the support body 10, the ventilation membrane 20 and the sealing member 30 is disposed within the range of the housing width region 101L. Consequently, the ventilation member 1 is disposed to be embedded in the device housing 101 in the thickness direction of the device housing 101. In other words, the ventilation member 1 is small in size occupying in the axial direction of the device housing 101.

Moreover, reduction in thickness of the ventilation member 1 as an single item is sought after.

Here, in the support body 10, as the ventilation membrane 20 and the sealing member 30 are disposed away from the center portion of the support body 10 in the axial direction, the support body 10 is required to be longer in the axial direction for holding the ventilation membrane 20 and supporting the sealing member 30. As a result, the thickness of the support body 10, namely, the entire thickness of the ventilation member 1 is increased.

In contrast thereto, in the ventilation member 1, the ventilation membrane 20 is disposed within the range of the sealing member width region 30L. This reduces the thickness of the ventilation member 1 in the axial direction. Moreover, the sealing member 30 is disposed within the range of the support body width region 10L. Therefore, reduction in thickness of the ventilation member 1 as a whole is further sought after.

Further, as shown in FIG. 2A, in the ventilation member 1, the end portion opening 111 opens toward the orthogonal direction (the intersecting direction) that is orthogonal to the attachment surface 101P of the device housing 101. Therefore, for example, as compared to a case in which the end portion opening 111 is made to face toward a direction along the attachment surface 101P, a structural portion forming a path for gas on the outside in the axial direction becomes unnecessary. Consequently, in the ventilation member 1, reduction in thickness of the ventilation member 1 in the axial direction is also sought after.

Next, a sealing characteristics investigation of the ventilation member 1 in the first exemplary embodiment will be described.

Figure 3:
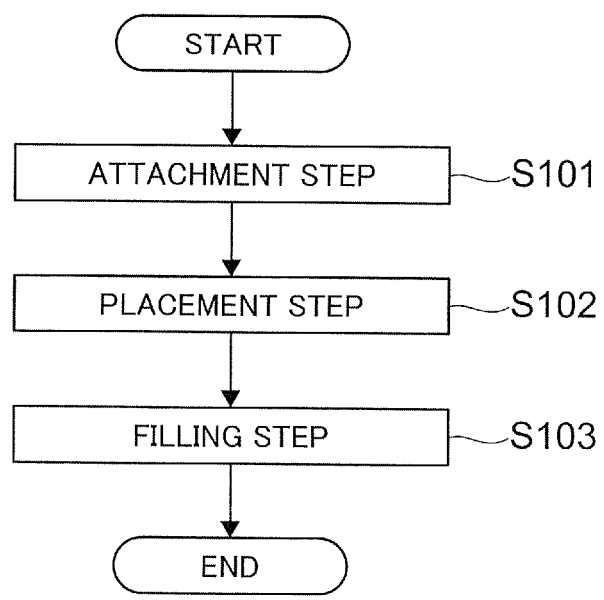
FIG. 3 is an illustration diagram of a sealing characteristics investigation of the ventilation member in the first exemplary embodiment.

FIG. 3 is an illustration diagram of the sealing characteristics investigation of the ventilation member 1 in the first exemplary embodiment.

Figure 4A:
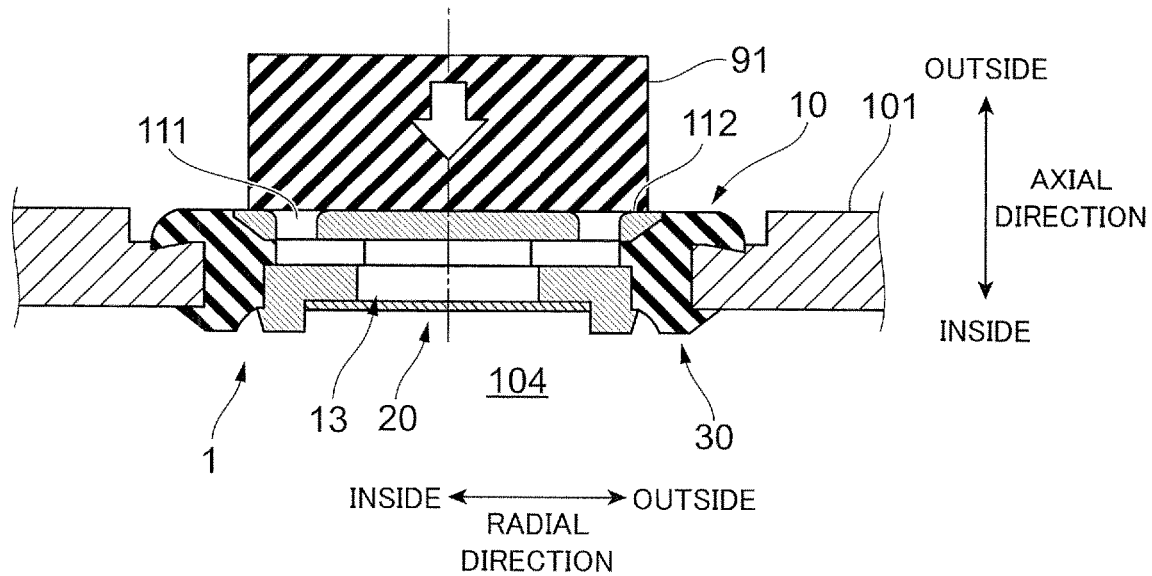
FIGS. 4A and 4B are diagrams showing a state in which a ventilation path in the ventilation member of the first exemplary embodiment is closed by a jig.
Figure 4B:
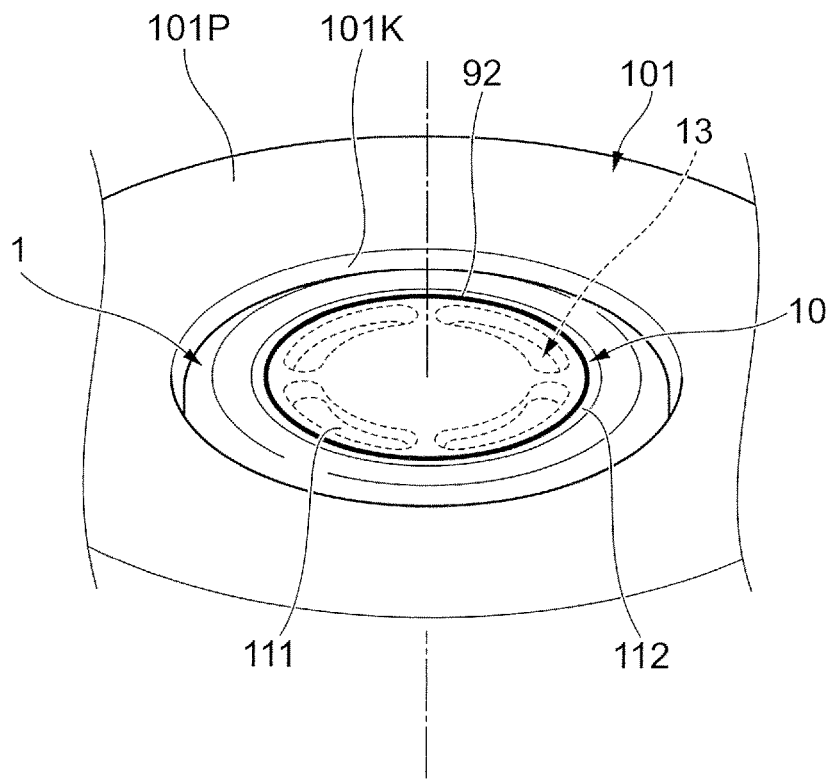

FIGS. 4A and 4B are diagrams showing a state in which a ventilation path in the ventilation member 1 of the first exemplary embodiment is closed by a jig.

In the state in which the ventilation member 1 is attached to the through hole 101K of the device housing 101 (refer to FIG. 1), in some cases, a sealing characteristics investigation to confirm whether or not the sealing member 30 seals between the support body 10 and the device housing 101 is performed. At this time, the ventilation member 1 itself allows flow of gas. Therefore, it is necessary to perform the sealing characteristics investigation of the sealing member 30 after closing the ventilation path 13 of the ventilation member 1. Hereinafter, the sealing characteristics investigation will be specifically described.

As shown in FIG. 3, first, an attachment step, which attaches the support body 10 provided with the ventilation membrane 20 to the through hole 101K of the device housing 101 with the sealing member 30 being interposed therebetween, is performed (S101). Thereafter, a placement step, which places a jig having hardness lower than that of the sealing member 30 and preventing flow of gas via the ventilation path 13 in the support body 10, is performed (S102).

Specifically, as shown in FIG. 4A, the ventilation path 13 is closed by use of an elastic jig 91 composed of an elastic material. The elastic jig 91 has a columnar shape. Moreover, the outer diameter of the elastic jig 91 corresponds to the outer diameter of the contacted portion 112. Then, the elastic jig 91 is pressed against the contacted portion 112. Consequently, the elastic jig 91 covers the end portion opening 111 from the outside, and thereby flow of gas via the ventilation path 13 is prevented. Here, in the ventilation member 1, the contacted portion 112 has height uniformly formed as described above. In other words, the contacted portion 112 has no asperities, such as, for example, joint locations among plural members or partial projections or depressions, to form gaps with the elastic jig 91. Accordingly, it is possible to easily close the ventilation path 13 in the ventilation member 1 by the elastic jig 91.

Thereafter, a filling step, which fills the housing interior 104 (refer to FIG. 1) with a predetermined gas, is performed (S103). If this increases the atmospheric pressure in the device housing 101, it is confirmed that the sealing member 30 has the sealing characteristics. On the other hand, if the atmospheric pressure in the device housing 104 is not increased, it is confirmed that the sealing characteristics of the sealing member 30 are insufficient.

Note that, in the example shown in FIG. 4A, the jig composed of the elastic material is brought into contact with the contacted portion 112; however, the jig is not limited to the example. For example, as shown in FIG. 4B, the sealing characteristics investigation may be performed by use of an adhesive jig 92 configured with a film-like member having adhesion. Specifically, the adhesive jig 92 in substantially a circular shape is applied to the contacted portion 112. As described above, in the ventilation member 1, the height of the contacted portion 112 is uniformly formed; therefore, there are no asperities to form gaps with, for example, the adhesive jig 92. Accordingly, it is possible to easily close the ventilation path 13 in the ventilation member 1 also by the adhesive jig 92.

Moreover, in the first exemplary embodiment, the end portion opening 111 opens toward the orthogonal direction (the intersecting direction) that is orthogonal to the attachment surface 101P of the device housing 101. Therefore, workability when works, such as, for example, pressing the elastic jig 91 against the contacted portion 112 or applying the adhesive jig 92 to the contacted portion 112, are carried out is increased.

Modified Example 1

Figure 5:
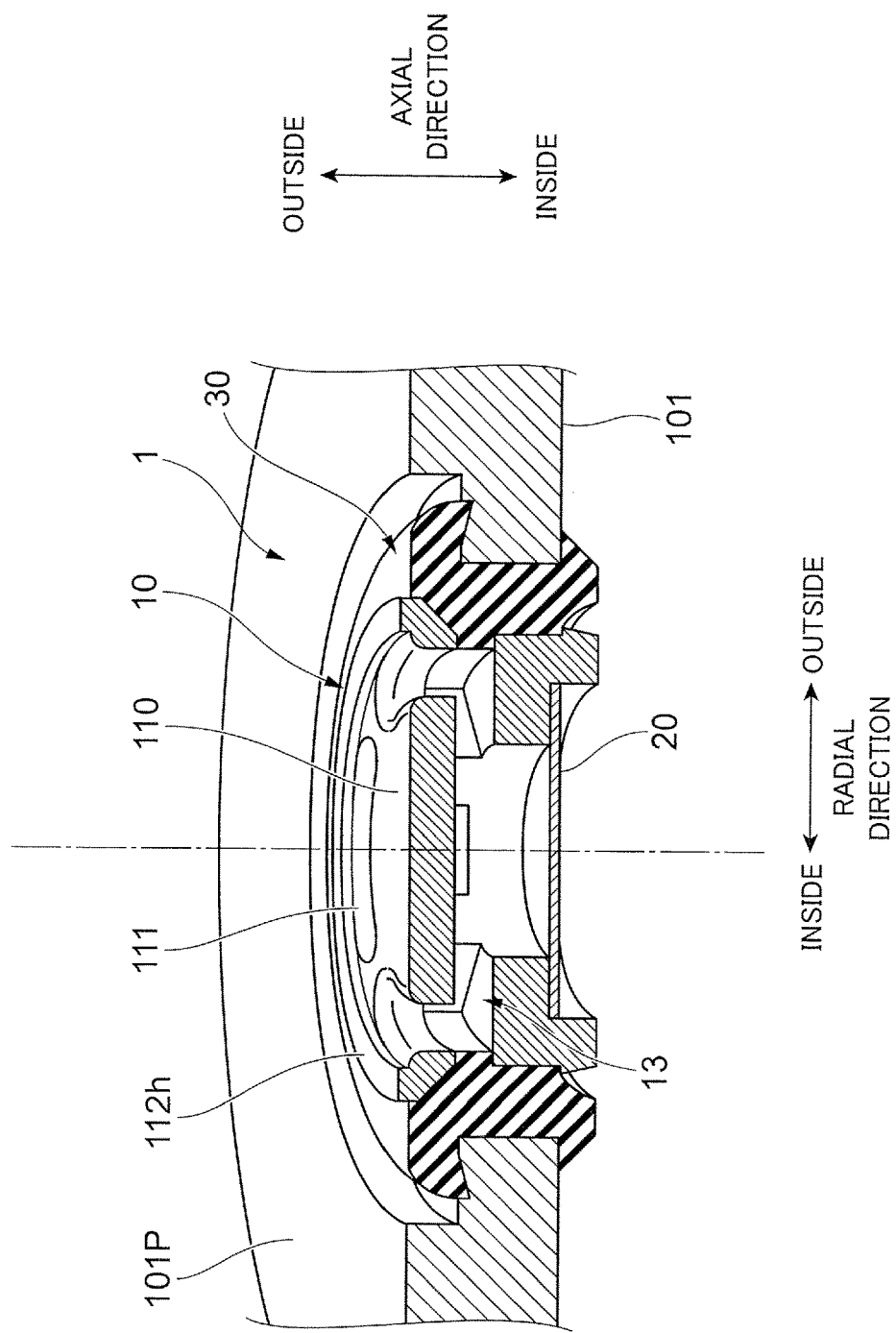
FIG. 5 is an illustration diagram of a ventilation member in a modified example 1.

FIG. 5 is an illustration diagram of a ventilation member 1 in a modified example 1.

As shown in FIG. 5, the basic configuration of the ventilation member 1 in the modified example 1 is similar to the ventilation member 1 in the above-described first exemplary embodiment. However, the ventilation member 1 of the modified example 1 includes a second contacted portion 112$h$ instead of the contacted portion 112 in the above-described first exemplary embodiment.

The second contacted portion 112$h$ (an example of the surrounding unit) has protrusion height in the axial direction higher than those of the center end portion 110 and the end portion openings 111. Moreover, the protrusion height in the axial direction of the second contacted portion 112$h$ is higher than that of the sealing member 30. In other words, in the ventilation member 1, the second contacted portion 112$h$ is protruded most toward the outside in the axial direction.

Moreover, in the second contacted portion 112$h$, the height is uniformly formed in the circumferential direction. The second contacted portion 112$h$ surrounds the periphery of the plural end portion openings 111.

In the ventilation member 1 of the modified example 1 configured as described above, when the aforementioned sealing characteristics investigation of the sealing member 30 is to be performed, the elastic jig 91 (refer to FIGS. 4A and 4B) is brought into contact with the second contacted portion 112$h$. At this time, in the ventilation member 1, since the second contacted portion 112$h$ is protruded in the axial direction, the elastic jig 91 is hardly interfered by other locations, such as the center end portion 110. In the ventilation member 1 of the modified example 1, this makes it possible to easily close the ventilation path 13 in the sealing characteristics investigation.

Note that the above description holds true in performing the investigation by use of the adhesive jig 92; therefore, it is possible to easily close the ventilation path 13.

Second Exemplary Embodiment

Next, a ventilation member 201 to which a second exemplary embodiment is applied will be described.

Figure 6A:
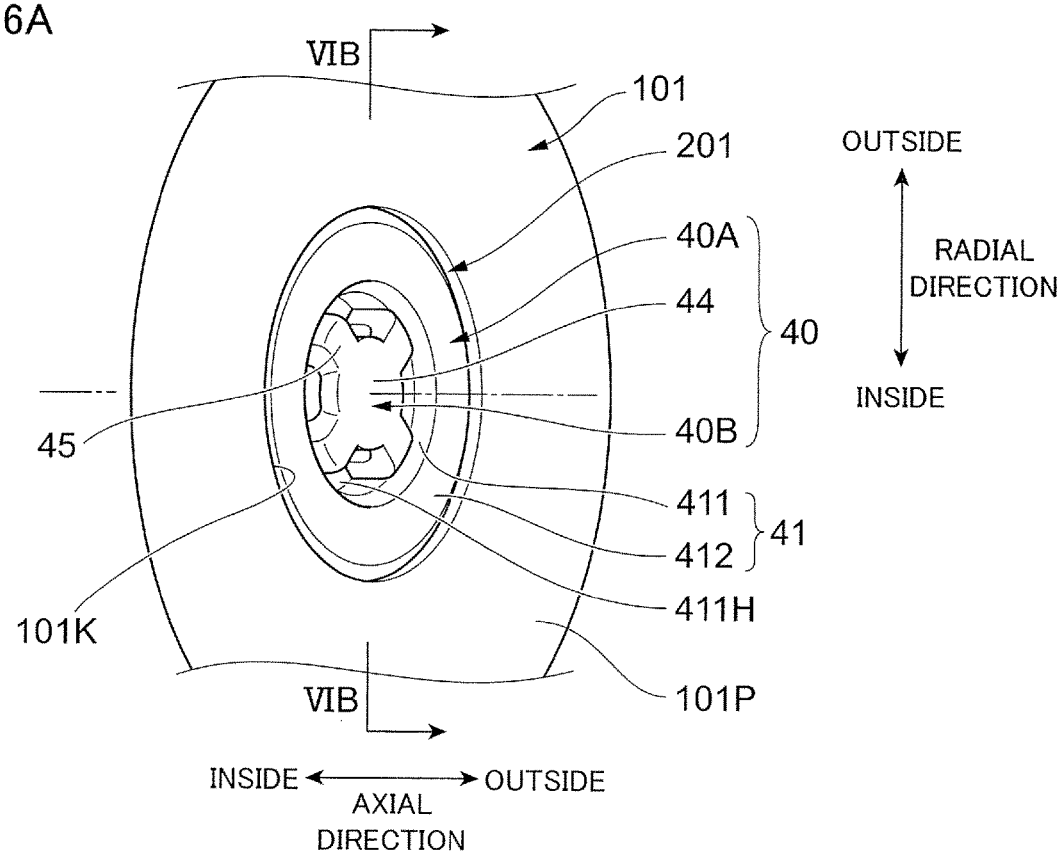
FIGS. 6A and 6B are illustration diagrams of a ventilation member of a second exemplary embodiment.
Figure 6B:
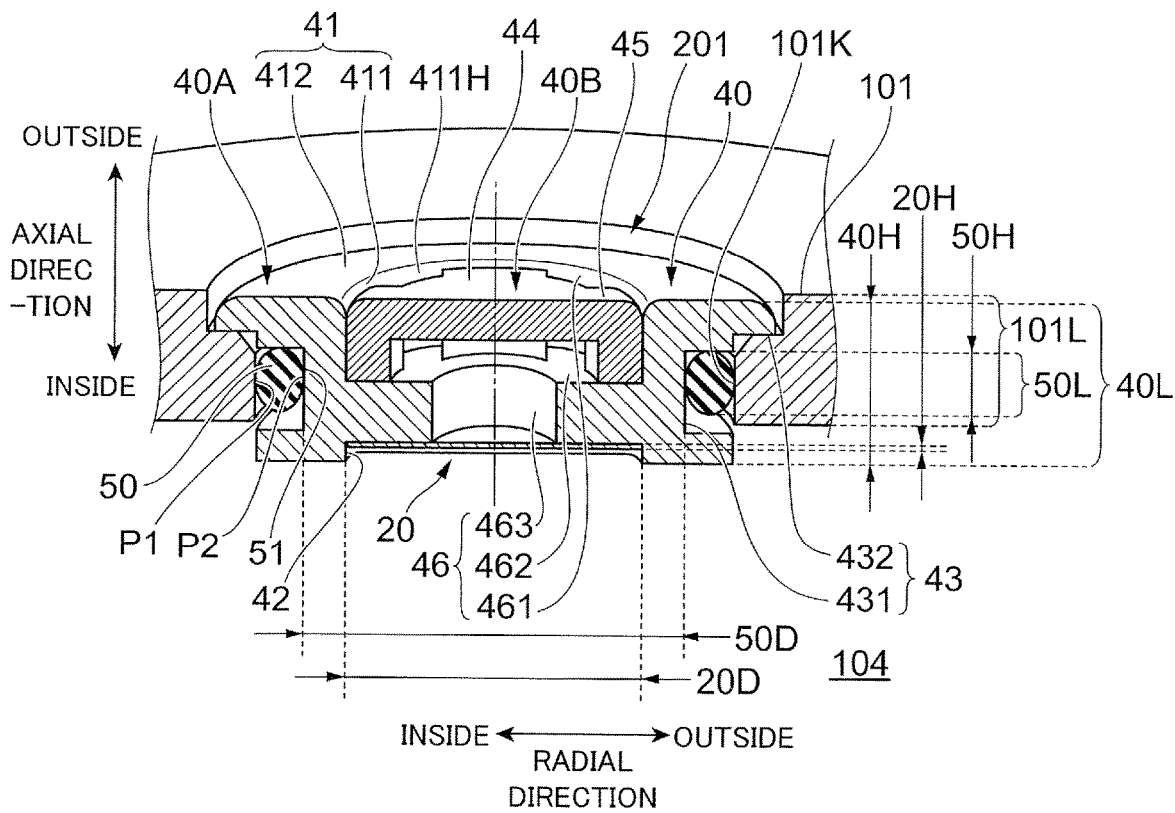

FIGS. 6A and 6B are illustration diagrams of the ventilation member 201 of the second exemplary embodiment.

Note that FIG. 6A shows the ventilation member 201 in the state of being attached to the device housing 101. Moreover, FIG. 6B is a perspective cross-sectional view along the VIB-VIB cross-sectional line shown in FIG. 6A.

Note that, in the description of the second exemplary embodiment, configurations similar to those in the first exemplary embodiment are assigned with same reference signs, and detailed descriptions thereof will be omitted.

As shown in FIGS. 6A and 6B, the ventilation member 201 includes: a support body 40 (an example of the main body unit); a ventilation membrane 20 supported by the support body 40; and a sealing member 50 (an example of the sealing unit) provided between the support body 40 and the device housing 101.

(Support Body 40)

As shown in FIG. 6B, the support body 40 includes a first support portion 40A and a second support portion 40B. Then, the first support portion 40A includes: an outside end portion 41 provided on the outside in the axial direction; a ventilation membrane holding portion 42 provided on the inside in the axial direction; and a connection portion 43 provided on the outside in the axial direction. Moreover, the second support portion 40B includes, as shown in FIG. 6A, a center end portion 44 and leg portions 45 provided on the outside in the radial direction of the center end portion 44. Then, as shown in FIG. 6B, in the support body 40, a ventilation path 46 is formed by the first support portion 40A and the second support portion 40B.

As shown in FIG. 6A, the outside end portion 41 faces toward the outside of the device housing 101. Then, the outside end portion 41 includes a container portion 411 provided on the inside in the radial direction; and a contacted portion 412 provided on the outside in the radial direction of the container portion 411.

The container portion 411 forms a portion inside of which the second support portion 40B is inserted. Then, in the ventilation member 201, end portion openings 411H are formed by the first support portion 40A and the second support portion 40B. The plural end portion openings 411H (in the second exemplary embodiment, four) are provided. The end portion opening 411H forms a termination on the outside in the axial direction of a first ventilation path portion 461, which will be described later. Moreover, each of the end portion openings 411H is formed into substantially an arc shape. Then, the plural end portion openings 411H are provided to be arranged in line at predetermined intervals in the circumferential direction of the outside end portion 41. The end portion opening 411H opens toward the orthogonal direction (the intersecting direction) that is orthogonal to the attachment surface 101P of the device housing 101.

As shown in FIG. 6B, the contacted portion 412 (an example of the surrounding unit) is, in the second exemplary embodiment, formed to have the same height as the center end portion 44. Then, the contacted portion 412 is formed to surround all of the plural end portion openings 411H. Moreover, in the second exemplary embodiment, the contacted portion 412 is a location in which protrusion height thereof in the axial direction is uniformly formed. In other words, the contacted portion 412 forms a surface into substantially an annular shape in the outside end portion 41. Then, the contacted portion 412 forms a location with which an investigation jig is in contact when the above-described sealing characteristics investigation is performed.

The ventilation membrane holding portion 42 is provided to face the housing interior 104. Moreover, the ventilation membrane holding portion 42 is formed into substantially a cylindrical shape. Then, the ventilation membrane holding portion 42 forms a location to which the ventilation membrane 20 is attached.

As shown in FIG. 6B, the connection portion 43 (an example of a reduction unit) includes a sealing member holding portion 431 and a housing connection portion 432 provided on the outside in the axial direction of the sealing member holding portion 431.

The sealing member holding portion 431 is formed in an annular-shaped groove recessed toward the inside in the radial direction. Then, the sealing member holding portion 431 forms a portion in which the sealing member 50 is engaged.

The housing connection portion 432 is formed by a surface facing toward the inside in the axial direction. When the support body 40 is pushed from the outside in the axial direction toward the inside in the axial direction, the housing connection portion 432 forms a portion to be caught on the device housing 101.

As shown in FIG. 6A, the center end portion 44 is formed into substantially a disk-like shape. Moreover, as shown in FIG. 6B, an outer diameter of the center end portion 44 is formed larger than an inner diameter of a third ventilation path portion 463, which will be described later. Then, the center end portion 44 is provided to a position facing the third ventilation path portion 463.

As shown in FIG. 6A, the leg portions 45 extend from the center end portion 44 toward the outside in the radial direction and protrude toward the inside in the axial direction. Moreover, the leg portions 45 are arranged at substantially the same predetermined intervals in the circumferential direction of the center end portion 44.

As shown in FIG. 6B, the ventilation path 46 includes, from the outside in the axial direction toward the inside in the axial direction, the first ventilation path portion 461, the second ventilation path portion 462 and the third ventilation path portion 463.

The first ventilation path portion 461 is formed by the container portion 411, the center end portion 44 and the leg portions 45. Then, the first ventilation path portion 461 forms a path for gas extending in the axial direction.

The second ventilation path portion 462 is formed by the container portion 411, the center end portion 44 and the leg portions 45. Then, the second ventilation path portion 462 forms a path for gas extending in the radial direction.

The third ventilation path portion 463 is formed into a cylindrical shape. Then, the third ventilation path portion 463 forms a path for gas extending in the axial direction. Moreover, the third ventilation path portion 463 faces the ventilation membrane 20 on the inside in the axial direction.

Then, in the ventilation member 201, there is provided the center end portion 44, the outer diameter of which is larger than the inner diameter of the third ventilation path portion 463 facing the ventilation membrane 20. Moreover, the ventilation member 201 is provided with the ventilation path 46 formed to extend in the axial direction and the radial direction. Accordingly, even when the inside of the ventilation member 201 is seen through the end portion opening 411H, the ventilation membrane 20 cannot be seen.

Note that the support body 40 of the second exemplary embodiment can be made by materials or a molding method similar to those for the support body 10 in the first exemplary embodiment.

(Sealing Member 50)

As shown in FIG. 6B, the sealing member 50 is an elastic member having substantially an annular shape with an opening portion 51 on the inside in the radial direction. Moreover, the cross-sectional shape of the sealing member 50 when being cut along the axial direction is substantially a circular shape. Then, the sealing member 50 is provided on the outside in the radial direction of the support body 40 and on the inside in the radial direction of the through hole 101K of the device housing 101, to thereby seal between the device housing 101 and the support body 40. In particular, the sealing member 50 contacts an inner surface P1 of the through hole 101K in the device housing 101 and an outer surface P2 on the outside in the radial direction of the support body 40 to be compressed and deformed in the radial direction, to thereby seal the device housing 101 and the support body 40.

Note that the sealing member 50 of the second exemplary embodiment can be made by materials similar to those for the sealing member 30 in the first exemplary embodiment.

As shown in FIG. 6A, in the ventilation member 201 configured as described above, the height of the contacted portion 412 is uniformly formed as described above; therefore, there are no asperities to form gaps with, for example, the elastic jig 91. Accordingly, in the above-described sealing characteristics investigation, it is possible to easily close the ventilation path 46 in the ventilation member 201 by the elastic jig 91 or the like.

Moreover, as shown in FIG. 6B, in the ventilation member 201, the connection portion 43 (an example of the reduction unit) reduces load applied to the sealing member 50 when the ventilation path 46 is closed in the sealing characteristics investigation.

In other words, the sealing member 50 is positioned inside the sealing member holding portion 431. Therefore, the sealing member 50 is in a positional relationship not to be sandwiched by the support body 40 and the device housing 101 in the axial direction. Moreover, the support body 40 is caught on the device housing 101 with the housing connection portion 432. Consequently, in the second exemplary embodiment, when the support body 40 is pressed by the elastic jig 91 from the outside in the axial direction toward the inside in the axial direction to close the ventilation path 46, the sealing member 50 is hardly deformed.

Here, in investigating the sealing characteristics of the sealing member 50, if the sealing member 50 is deformed, use conditions differ from normal use conditions of the sealing member 50 when the investigation is not performed. In contrast thereto, in the ventilation member 201, it is possible to perform the sealing characteristics investigation of the sealing member 50 under the conditions same as the normal use conditions.

Note that, in terms of reducing the load applied to the sealing member 50, any one of the sealing member holding portion 431 and the housing connection portion 432 may be provided.

Subsequently, detailed description will be given of relationship between sizes and positions of the components in the ventilation member 201.

As shown in FIG. 6B, the width of the support body 40 (the first support portion 40A) in the axial direction is referred to as a support body width 40H. The width of the ventilation membrane 20 in the axial direction is referred to as a ventilation membrane width 20H. The width of the sealing member 50 in the axial direction is referred to as a sealing member width 50H.

Then, in the second exemplary embodiment, the sealing member width 50H is formed thinner than the support body width 40H. The ventilation membrane width 20H is formed thinner than the support body width 40H and the sealing member width 50H.

Moreover, in the cross section of the ventilation member 201 shown in FIG. 6B, a region which the support body 40 (the first support portion 40A) occupies in the axial direction is referred to as a support body width region 40L. Moreover, a region which the sealing member 50 occupies in the axial direction is referred to as a sealing member width region 50L.

Then, the sealing member 50 is disposed within the range of the support body width region 40L in the axial direction. Moreover, the sealing member 50 is disposed within the range of the housing width region 101L in the axial direction.

Further, the outer diameter 20D (the outer shape) of the ventilation membrane 20 is smaller than the inner diameter 50D (the inner shape) of the opening portion 51 in the sealing member 50.

Then, in the ventilation member 201, the ventilation membrane 20 is provided inside the opening portion 51 of the sealing member 50 in the radial direction.

As described above, in the ventilation member 201, the support body 40, the ventilation membrane 20 and the sealing member 50 are arranged to be in line in the radial direction. Then, in the ventilation member 201, at least a part of each of the support body 40 and the sealing member 50 is disposed within the range of the housing width region 101L. Consequently, the ventilation member 201 is disposed to be embedded in the device housing 101 in the thickness direction of the device housing 101. In other words, the ventilation member 201 is small in size occupying in the axial direction of the device housing 101.

Then, in the ventilation member 201, the sealing member 50 is disposed inside the support body width region 40L. Further, all of the sealing member 50 is disposed on the inside in the radial direction of the through hole 101K of the device housing 101. Therefore, reduction in thickness of the ventilation member 201 as a whole is sought after.

Moreover, in the ventilation member 201, the end portion opening 411H opens toward the orthogonal direction that is orthogonal to the attachment surface 101P of the device housing 101. Consequently, in the ventilation member 201, reduction in thickness of the ventilation member 201 in the axial direction is also sought after.

Ventilation Member 201 in Modified Example 2

Figure 7:
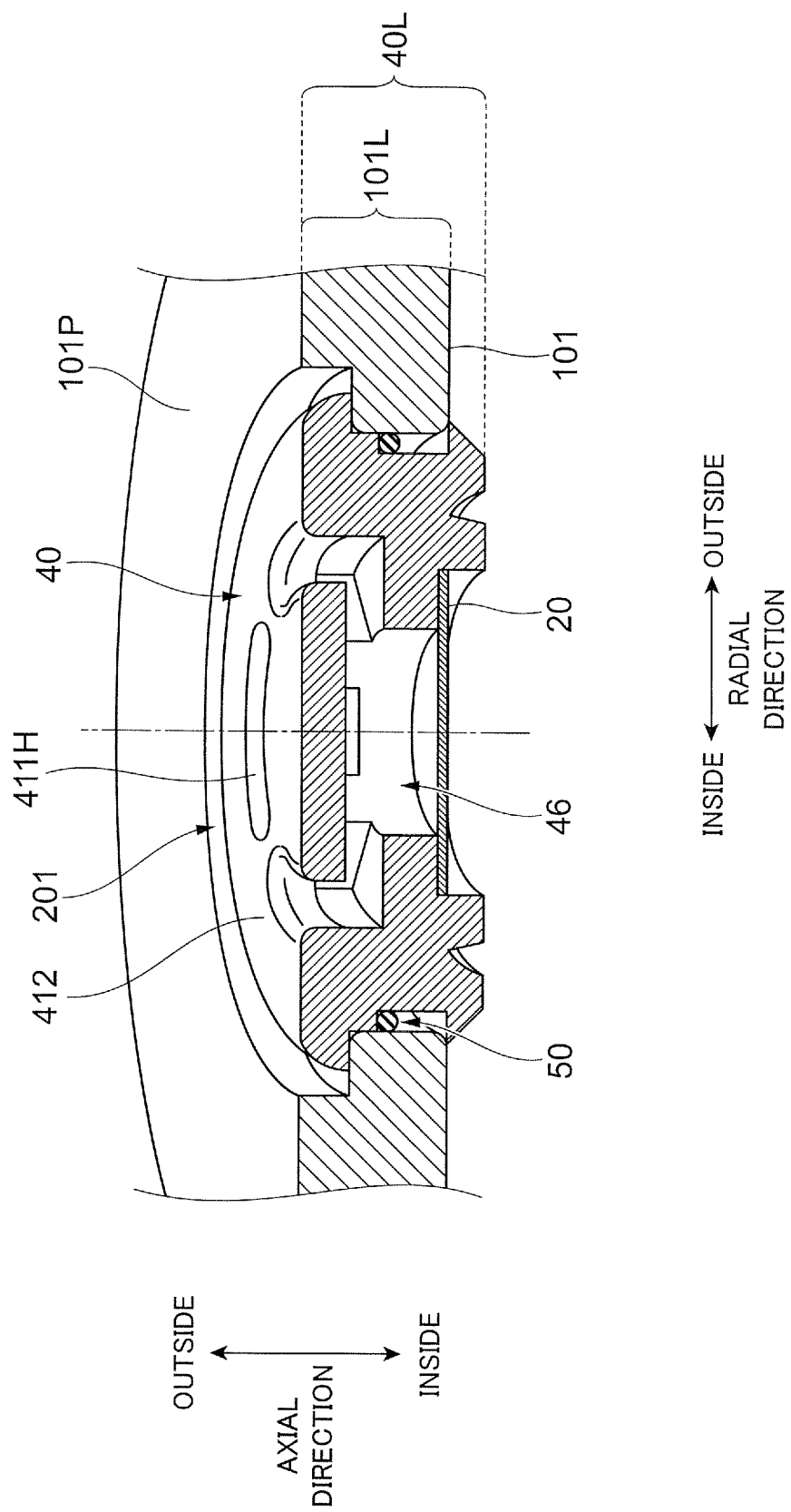
FIG. 7 is a perspective cross-sectional view of a ventilation member of a modified example 2.

FIG. 7 is a perspective cross-sectional view of the ventilation member 201 of a modified example 2.

The ventilation member 201 of the modified example 2 includes the support body 40, the sealing member 50 and the ventilation membrane 20. The basic configuration of the ventilation member 201 in the modified example 2 is similar to the ventilation member 201 in the second exemplary embodiment. However, the ventilation member 201 of the modified example 2 includes a support body 40 integrally formed from two members in the second exemplary embodiment, the first support portion 40A and the second support portion 40B.

In the ventilation member 201 in the modified example 2 formed as described above, since the ventilation membrane 20, the support body 40 and the sealing member 50 are arranged in line in the radial direction, the thickness in the axial direction is reduced. In particular, since the sealing member 50 is disposed within the support body width region 40L of the support body 40, reduction in thickness is sought after also in the ventilation member 201 as a whole.

Then, in the ventilation member 201 of the modified example 2, similar to the ventilation member 201 of the second exemplary embodiment, it is possible to easily close the ventilation path 46.

Third Exemplary Embodiment

Next, a ventilation member 301 to which a third exemplary embodiment is applied will be described.

Figure 8A:
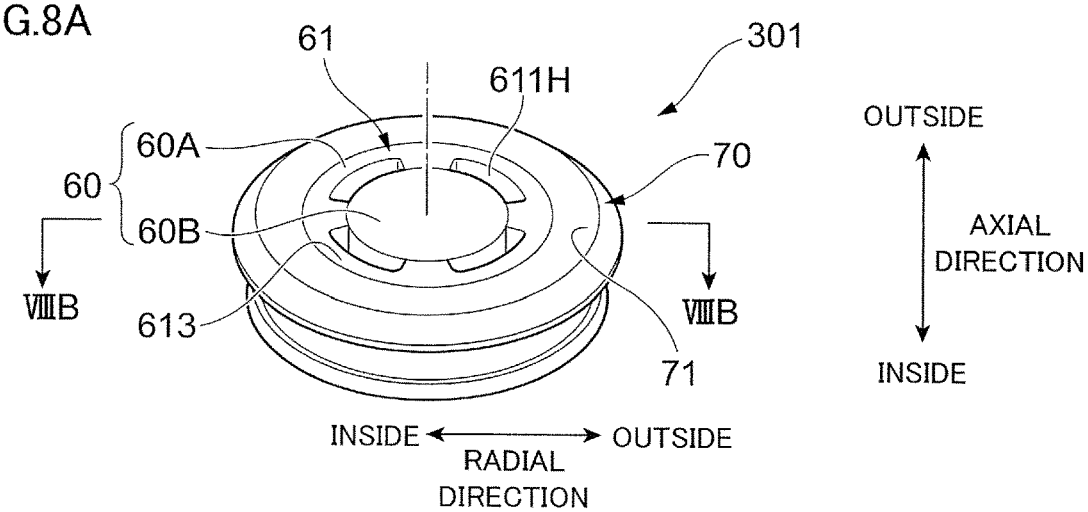
FIGS. 8A, 8B and 8C are illustration diagrams of a ventilation member of a third exemplary embodiment.
Figure 8B:
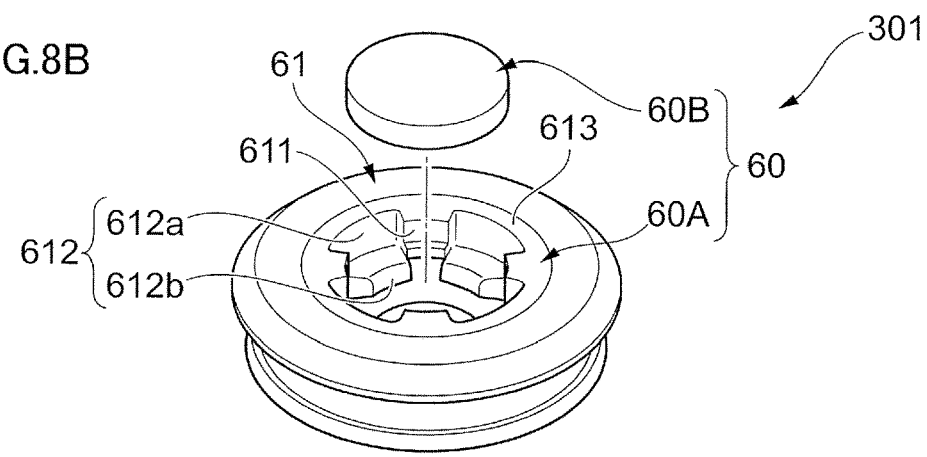
Figure 8C:
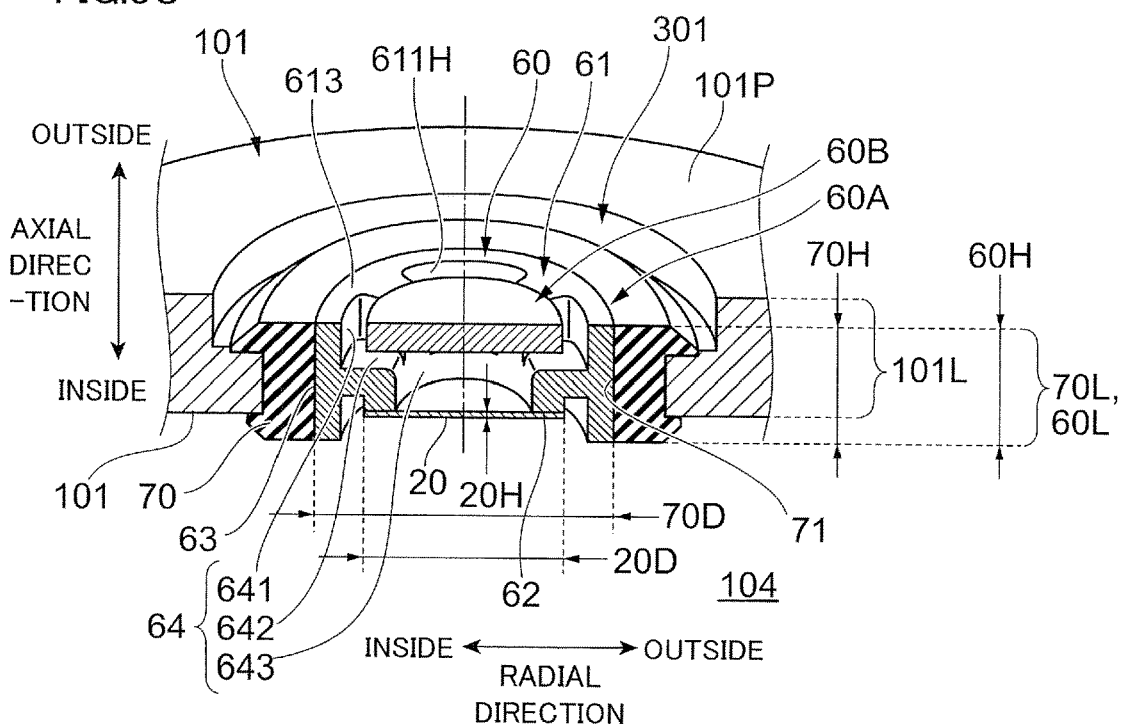

FIGS. 8A to 8C are illustration diagrams of the ventilation member 301 of the third exemplary embodiment.

Note that FIG. 8A is an overall perspective view of the ventilation member 301. FIG. 8B is an exploded perspective view of the ventilation member 301. FIG. 8C is a perspective cross-sectional view along the VIIIB-VIIIB cross-sectional line shown in FIG. 8A.

Note that, in the description of the third exemplary embodiment, configurations similar to those in other exemplary embodiments described above are assigned with same reference signs, and detailed descriptions thereof will be omitted.

As shown in FIGS. 8A and 8B, the ventilation member 301 includes: a support body 60 (an example of the main body unit); a ventilation membrane 20 supported by the support body 60; and a sealing member 70 (an example of the sealing unit) provided between the support body 60 and the device housing 101.

(Support Body 60)

As shown in FIG. 8C, the support body 60 includes a first support portion 60A and a second support portion 60B. Then, the first support portion 60A includes: an outside end portion 61 provided on the outside in the axial direction; a ventilation membrane holding portion 62 provided on the inside in the axial direction; and a facing portion 63 provided on the outside in the axial direction. Then, in the support body 60, a ventilation path 64 is formed by the first support portion 60A and the second support portion 60B.

As shown in FIG. 8B, the outside end portion 61 faces toward the outside of the device housing 101. Then, the outside end portion 61 includes: a container portion 611 provided on the inside in the radial direction; path formation portions 612 provided on the outside in the radial direction;

and a contacted portion 613 provided on the outside in the radial direction of the path formation portions 612.

As shown in FIG. 8B, the container portion 611 forms a portion inside of which the second support portion 60B is inserted. Then, as shown in FIG. 8A, in the ventilation member 301, end portion openings 611H are formed by the first support portion 60A and the second support portion 60B. The plural end portion openings 611H (in the third exemplary embodiment, four) are provided. As shown in FIG. 8C, the end portion opening 611H forms a termination on the outside in the axial direction of the ventilation path 64. Moreover, as shown in FIG. 8A, each of the end portion openings 611H is formed into substantially an arc shape. Then, the plural end portion openings 611H are provided to be arranged in line at predetermined intervals in the circumferential direction of the outside end portion 61. Then, as shown in FIG. 8C, the end portion opening 611H opens toward the orthogonal direction that is orthogonal to the attachment surface 101P of the device housing 101.

As shown in FIG. 8B, each of the path formation portions 612 includes a first path formation portion 612a and a second path formation portion 612b provided on the inside in the axial direction of the first path formation portion 612a. The first path formation portion 612a is formed to be recessed toward the outside in the radial direction of the container portion 611. Moreover, the second path formation portion 612b is formed to be protruded toward the inside in the radial direction of the container portion 611.

As shown in FIG. 8A, the contacted portion 613 is, in the third exemplary embodiment, formed to have the same height as the second support portion 60B. Then, the contacted portion 613 is formed to surround all of the plural end portion openings 611H. Moreover, in the third exemplary embodiment, the contacted portion 613 is a location in which protrusion height thereof in the axial direction is uniformly formed. In other words, the contacted portion 613 forms a surface into substantially an annular shape in the outside end portion 61. Then, the contacted portion 613 forms a location with which an investigation jig is in contact when the above-described sealing characteristics investigation is performed.

As shown in FIG. 8C, the ventilation membrane holding portion 62 is provided to face the housing interior 104. Moreover, the ventilation membrane holding portion 62 is formed into substantially a cylindrical shape. Then, the ventilation membrane holding portion 62 forms a location to which the ventilation membrane 20 is attached.

The facing portion 63 is formed into substantially a cylindrical shape. Then, the facing portion 63 forms a portion in which the sealing member 70 is engaged.

As shown in FIG. 8B, the second support portion 60B is formed into substantially a disk-like shape. Moreover, an outer diameter of the second support portion 60B is formed larger than an inner diameter of a second ventilation path portion 642, which will be described later. Then, as shown in FIG. 8C, the second support portion 60B is provided at a position lined with the second ventilation path portion 642 in the axial direction on the outside in the axial direction of the second ventilation path portion 642.

As shown in FIG. 8C, the ventilation path 64 includes: a first ventilation path portion 641 formed on the outside in the axial direction; a second ventilation path portion 642 formed on the inside in the axial direction of the first ventilation path portion 641; and a third ventilation path portion 643 formed on the inside in the axial direction of the second ventilation path portion 642.

The first ventilation path portion 641 is formed by the second support portion 60B and the first path formation portion 612a (refer to FIG. 8B). Then, the first ventilation path portion 641 forms a path for gas extending in the axial direction.

The second ventilation path portion 642 is formed by the second support portion 60B and the second path formation portion 612b (refer to FIG. 8B). Then, the second ventilation path portion 642 forms a path for gas extending in the radial direction.

The third ventilation path portion 643 is formed into substantially a columnar shape. Then, the third ventilation path portion 643 forms a path for gas extending in the axial direction. Moreover, the third ventilation path portion 643 faces the ventilation membrane 20 on the inside in the axial direction.

Then, as shown in FIG. 8C, in the ventilation member 301, there is provided the second support portion 60B, the outer diameter of which is larger than the inner diameter of the third ventilation path portion 643 facing the ventilation membrane 20. Moreover, the ventilation member 301 is provided with the ventilation path 64 formed to extend in the axial direction and the radial direction. Accordingly, even when the inside of the ventilation member 301 is seen through the end portion opening 611H, the ventilation membrane 20 cannot be seen.

Note that the support body 60 of the third exemplary embodiment can be made by materials or a molding method similar to those for the support body 10 in the first exemplary embodiment.

(Sealing Member 70)

As shown in FIG. 8A, the basic configuration of the sealing member 70 is similar to the sealing member 30 in the above-described first exemplary embodiment. The sealing member 70 includes an opening portion 71 on the inside in the radial direction. Then, as shown in FIG. 8C, in the sealing member 70, the inner surface of the opening portion 71 is flat. The sealing member 70 receives press fitting of the facing portion 63 of the support body 60, which is in a cylindrical shape with a side surface being flat.

Note that the sealing member 70 of the third exemplary embodiment can be made by materials similar to those for the sealing member 30 in the first exemplary embodiment.

In the ventilation member 301 configured as described above, the height of the contacted portion 613 is uniformly formed as described above; therefore, there are no asperities to form gaps with, for example, the elastic jig 91. Accordingly, in the above-described sealing characteristics investigation, it is possible to easily close the ventilation path 64 in the ventilation member 301 by the elastic jig 91, the adhesive jig 92 or the like.

Subsequently, detailed description will be given of relationship between sizes and positions of the components in the ventilation member 301.

As shown in FIG. 8C, the width of the support body 60 (the first support portion 60A) in the axial direction is referred to as a support body width 60H. Moreover, the width of the ventilation membrane 20 in the axial direction is referred to as a ventilation membrane width 20H. Further, the width of the sealing member 70 in the axial direction is referred to as a sealing member width 70H.

Then, the sealing member width 70H is formed to be the same width as the support body width 60H. Moreover, the ventilation membrane width 20H is formed thinner than the support body width 60H and the sealing member width 70H.

Moreover, in the cross section of the ventilation member 301 shown in FIG. 8B, a region which the support body 60

(the first support portion 60A) occupies in the axial direction is referred to as a support body width region 60L. Moreover, a region which the sealing member 70 occupies in the axial direction is referred to as a sealing member width region 70L.

Then, the ventilation membrane 20 is disposed within the range of the support body width region 60L in the axial direction. Further, the ventilation membrane 20 is disposed within the range of the sealing member width region 70L in the axial direction.

Moreover, the sealing member width region 70L is disposed within the range of the support body width region 60L.

Further, as shown in FIG. 8C, the outer diameter 20D of the ventilation membrane 20 is smaller than the inner diameter 70D of the opening portion 71 in the sealing member 70.

Then, in the ventilation member 301, the ventilation membrane 20 is provided inside the opening portion 71 of the sealing member 70 in the radial direction and the axial direction.

As described above, in the ventilation member 301, the support body 60, the ventilation membrane 20 and the sealing member 70 are arranged to be in line in the radial direction. Then, in the ventilation member 301, at least a part of each of the support body 60, the ventilation membrane 20 and the sealing member 70 is disposed within the range of the housing width region 101L. Consequently, the ventilation member 301 is disposed to be embedded in the device housing 101 in the thickness direction thereof. In other words, the ventilation member 301 is small in size occupying in the axial direction of the device housing 101.

Then, in the ventilation member 301, the ventilation membrane 20 is disposed within the range of the sealing member width region 70L. This reduces the thickness of the ventilation member 301 in the axial direction. Moreover, the sealing member 70 is disposed within the range of the support body width region 60L. Therefore, reduction in thickness of the ventilation member 301 as a whole is further sought after.

Moreover, in the ventilation member 301, the end portion opening 611H opens toward the orthogonal direction that is orthogonal to the attachment surface 101P of the device housing 101. Consequently, in the ventilation member 301, reduction in thickness of the ventilation member 301 in the axial direction is also sought after.

Fourth Exemplary Embodiment

Next, a ventilation member 401 to which a fourth exemplary embodiment is applied will be described.

Figure 9A:
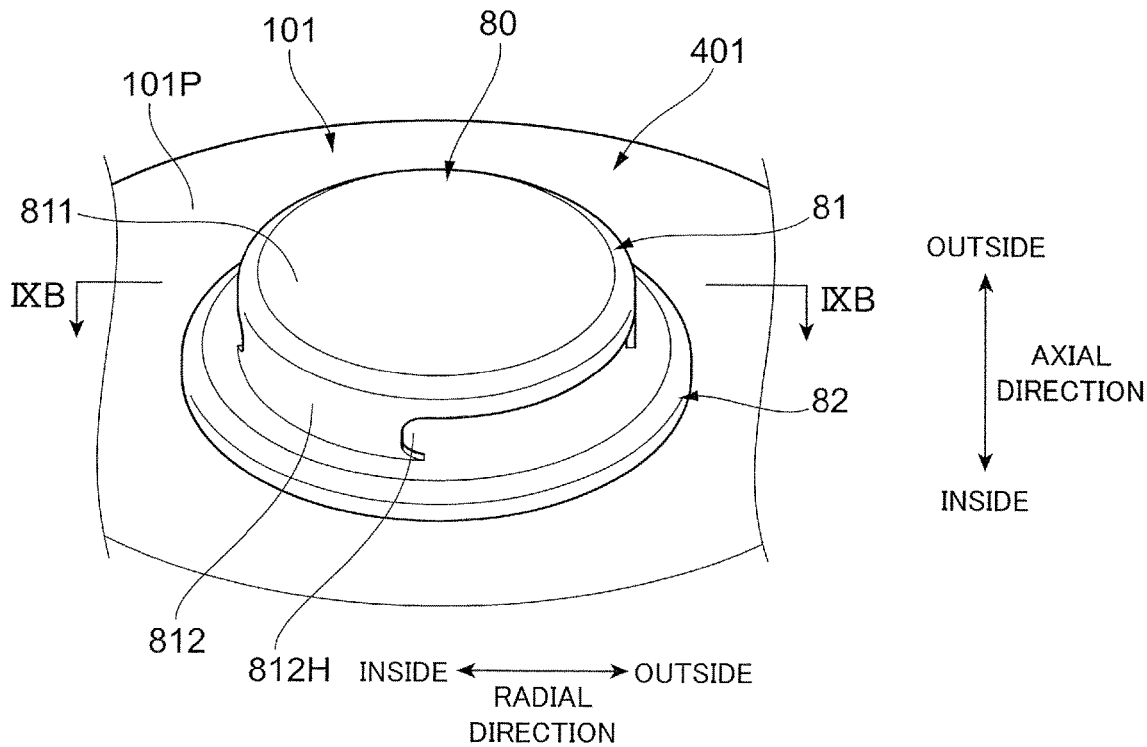
FIGS. 9A and 9B are illustration diagrams of a ventilation member of a fourth exemplary embodiment.
Figure 9B:
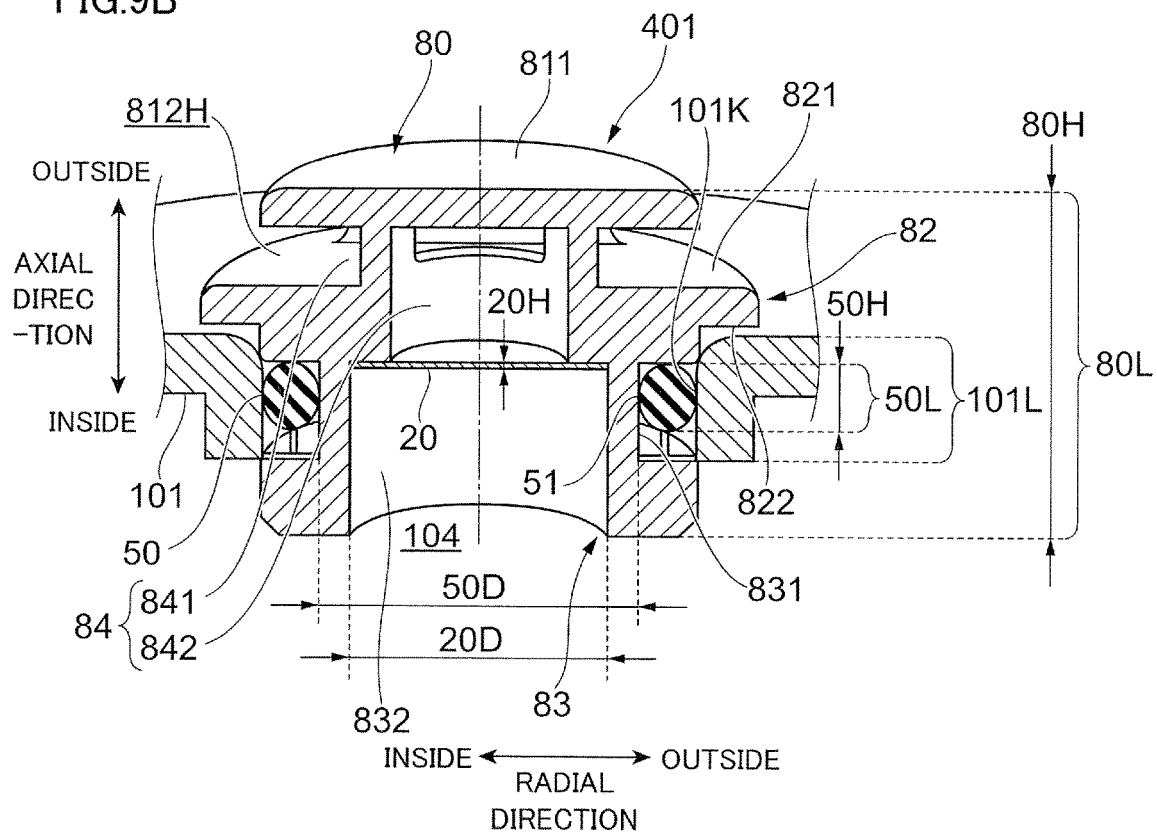

FIGS. 9A and 9B are illustration diagrams of the ventilation member 401 of the fourth exemplary embodiment.

Note that FIG. 9A is an overall perspective view of the ventilation member 401. FIG. 9B is a perspective cross-sectional view along the IXB-IXB cross-sectional line shown in FIG. 9A.

Note that, in the description of the fourth exemplary embodiment, configurations similar to those in other exemplary embodiments described above are assigned with same reference signs, and detailed descriptions thereof will be omitted.

The ventilation member 401 includes: a support body 80 (an example of the main body unit); the ventilation membrane 20 supported by the support body 80; and the sealing member 50 provided between the support body 80 and the device housing 101.

(Support Body 80)

The support body 80 includes: an opening formation portion 81 provided on the outside in the axial direction; a flange portion 82 provided on the inside in the axial direction of the opening formation portion 81; a cylinder portion 83 provided on the inside in the axial direction of the flange portion 82; and a ventilation path 84.

The opening formation portion 81 includes an outside end portion 811 and an outer circumferential portion 812. The outside end portion 811 is formed into substantially a disk-like shape. Moreover, the outer circumferential portion 812 is formed into substantially a cylindrical shape. Then, in the outer circumferential portion 812, plural (in the fourth exemplary embodiment, two) end portion openings 812H are formed. As shown in FIG. 9A, the end portion opening 812H opens toward a direction along the attachment surface 101P of the device housing 101 (the radial direction). Note that, in the outer circumferential portion 812, except for the locations where the end portion openings 812H are formed, no asperities are formed in the circumferential direction, and thereby the height (length) in the radial direction is uniformly formed.

The flange portion 82 is protruded toward the outside in the radial direction than the opening formation portion 81 in the radial direction. Then, the flange portion 82 includes an outside surface 821 facing toward the outside in the axial direction and an inside surface 822 facing toward the inside in the axial direction.

The outside surface 821 is provided on the outside in the radial direction of the end portion openings 812H. Then, the flange portion 82 is formed to surround all of the plural end portion openings 812H. Moreover, in the fourth exemplary embodiment, the flange portion 82 is a location in which protrusion height thereof in the axial direction is uniformly formed. In other words, the flange portion 82 forms a surface into substantially an annular shape. Then, the flange portion 82 forms a location with which an investigation jig is in contact when the above-described sealing characteristics investigation is performed.

When the support body 80 is pressed from the outside in the axial direction toward the inside in the axial direction, the inside surface 822 forms a portion to be caught on the device housing 101.

The cylinder portion 83 includes a sealing member holding portion 831 and a ventilation membrane holding portion 832.

The sealing member holding portion 831 is formed in an annular-shaped groove recessed toward the inside in the radial direction. Then, the sealing member holding portion 831 forms a portion in which the sealing member 50 is engaged.

The ventilation membrane holding portion 832 is formed larger than an inner diameter of a second ventilation path portion 842, which will be described later. Then, the ventilation membrane holding portion 832 holds the ventilation membrane 20 by a step formed by a difference in the inner diameter with the second ventilation path portion 842.

The ventilation path 84 includes a first ventilation path portion 841 formed on the outside in the axial direction and the second ventilation path portion 842 formed on the inside in the axial direction of the first ventilation path portion 841.

The first ventilation path portion 841 forms a path for gas extending in the radial direction. Moreover, the first ventilation path portion 841 is connected to the end portion openings 812H on the outside in the radial direction. The second ventilation path portion 842 forms a path for gas extending in the axial direction.

Then, as shown in FIG. 9B, in the ventilation member 401, there is provided the outside end portion 811, the outer diameter of which is larger than the inner diameter of the second ventilation path portion 842 facing the ventilation membrane 20. Moreover, the ventilation member 401 is provided with the ventilation path 84 formed to extend in the axial direction and the radial direction. Accordingly, even when the inside of the ventilation member 401 is seen through the end portion opening 812H, the ventilation membrane 20 cannot be seen.

Note that the support body 80 of the fourth exemplary embodiment can be made by materials or a molding method similar to those for the support body 10 in the first exemplary embodiment.

Subsequently, detailed description will be given of relationship between sizes and positions of the components in the ventilation member 401.

As shown in FIG. 9B, the width of the support body 80 in the axial direction is referred to as a support body width 80H. Moreover, the width of the ventilation membrane 20 in the axial direction is referred to as a ventilation membrane width 20H. Further, the width of the sealing member 50 in the axial direction is referred to as a sealing member width 50H.

Then, the sealing member width 50H is formed thinner than the support body width 80H. Moreover, the ventilation membrane width 20H is formed thinner than the support body width 80H and the sealing member width 50H.

Moreover, in the cross section of the ventilation member 401 in FIG. 9B, a region which the support body 80 occupies in the axial direction is referred to as a support body width region 80L. Moreover, a region which the sealing member 50 occupies in the axial direction is referred to as a sealing member width region 50L.

Then, the ventilation membrane 20 is disposed within the range of the sealing member width region 50L in the axial direction.

Next, as shown in FIG. 9B, the outer diameter 20D of the ventilation membrane 20 is smaller than the inner diameter 50D of the opening portion 51 in the sealing member 50.

Then, in the ventilation member 401, the ventilation membrane 20 is provided inside the opening portion 51 of the sealing member 50 in the axial direction and the radial direction.

As described above, in the ventilation member 401, the support body 80, the ventilation membrane 20 and the sealing member 50 are arranged to be in line in the radial direction. Then, in the ventilation member 401, at least a part of each of the support body 80, the ventilation membrane 20 and the sealing member 50 is disposed within the range of the housing width region 101L. Consequently, the ventilation member 401 is disposed to be embedded in the device housing 101 in the thickness direction thereof. In other words, the ventilation member 401 is small in size occupying in the axial direction of the device housing 101.

Then, in the ventilation member 401, the ventilation membrane 20 is disposed within the range of the sealing member width region 50L. This reduces the thickness of the ventilation member 401 in the axial direction. Moreover, the sealing member 50 is disposed within the range of the support body width region 80L. Further, all of the sealing member 50 is disposed on the inside in the radial direction of the through hole 101K of the device housing 101. Therefore, reduction in thickness of the ventilation member 401 as a whole is sought after.

Figure 10A:
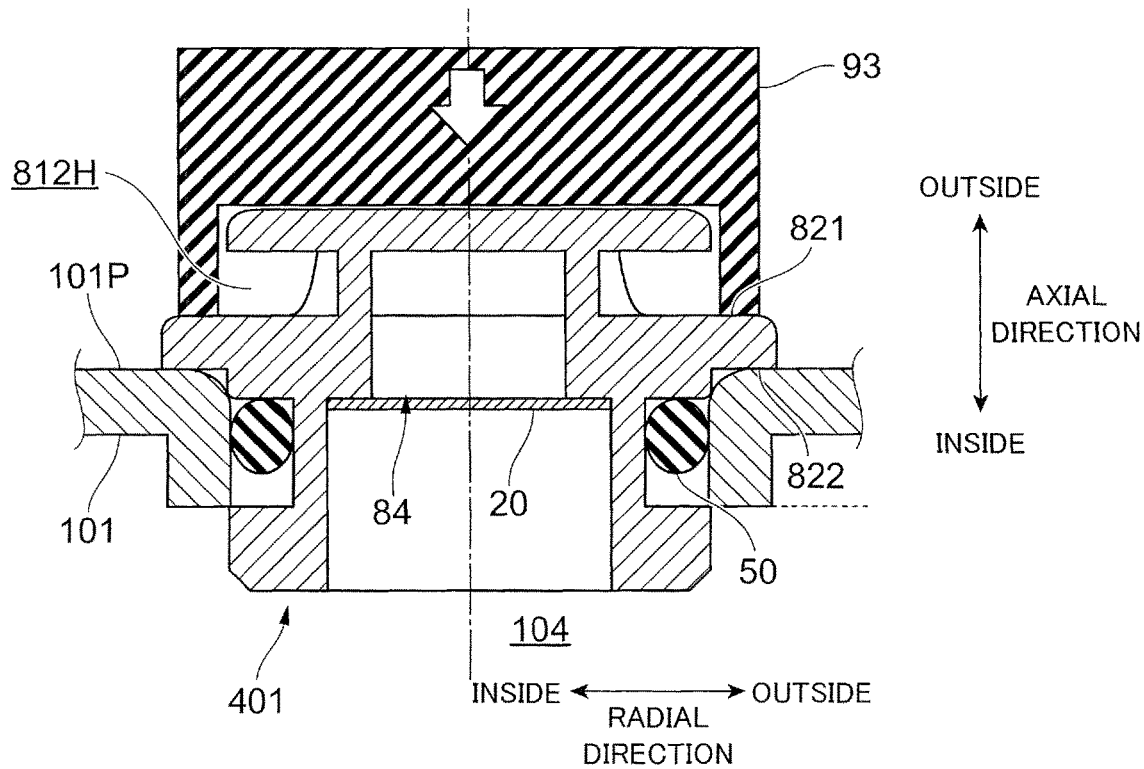
FIGS. 10A and 10B are illustration diagrams of a sealing characteristics investigation of a ventilation member in the fourth exemplary embodiment.
Figure 10B:
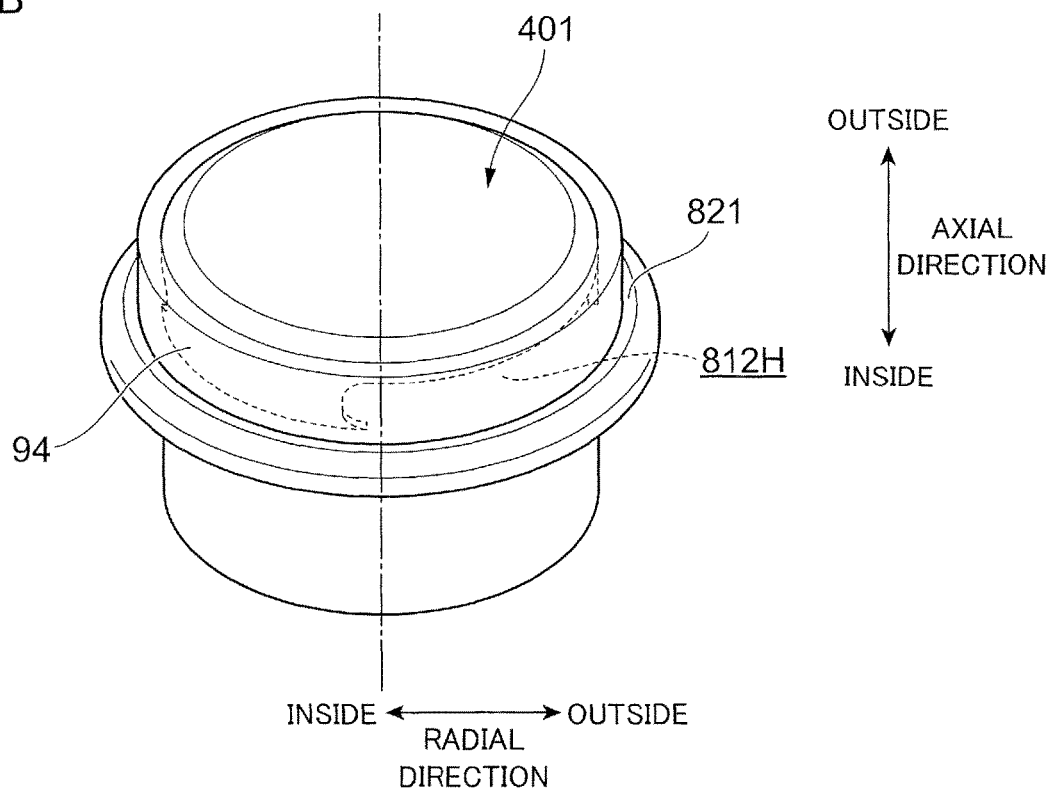

FIGS. 10A and 10B are illustration diagrams of the sealing characteristics investigation of the ventilation member 401 in the fourth exemplary embodiment.

As shown in FIG. 10A, to perform the sealing characteristics investigation of the ventilation member 401, the opening formation portion 81 is covered and the elastic jig 93 capable of contacting the outside surface 821 of the flange portion 82 is used. Then, by pressing the elastic jig 93 against the ventilation member 401, flow of gas via the ventilation path 84 of the ventilation member 401 is prevented.

Here, in the ventilation member 401, the height of the outside surface 821 is uniformly formed as described above; therefore, there are no asperities to form gaps with, for example, the elastic jig 93. Accordingly, in the above-described sealing characteristics investigation, it is possible to easily close the ventilation path 84 in the ventilation member 401 by, for example, the elastic jig 93.

Moreover, in the ventilation member 401, the sealing member 50 is positioned inside the sealing member holding portion 831. Therefore, the sealing member 50 is in a positional relationship not to be sandwiched by the support body 80 and the device housing 101 in the axial direction. Moreover, the support body 80 is caught on the device housing 101 with the inside surface 822 of the flange portion 82. Consequently, in the fourth exemplary embodiment, when the support body 80 is pressed by the elastic jig 93 from the outside in the axial direction toward the inside in the axial direction to close the ventilation path 84, the sealing member 50 is hardly deformed.

Note that, in terms of reducing the load applied to the sealing member 50, any one of the sealing member holding portion 831 and the flange portion 82 may be provided.

Note that, in the example shown in FIG. 10A, the ventilation member 84 is closed by pressing the elastic jig 93 against the ventilation member 401; however, the jig is not limited to the example.

For example, as shown in FIG. 10B, the sealing characteristics investigation of the ventilation member 401 may be performed by use of an annular elastic jig 94 configured with a tubular elastic member.

Here, as in the ventilation member 401, when the end portion opening 812H faces toward the direction along the attachment surface 101P of the device housing 101, the direction of the force applied to the ventilation member 401 for closing the ventilation path 84 becomes the radial direction. Therefore, in performing the sealing characteristics investigation, the load applied to the sealing member 50 is reduced; therefore, the investigation can be performed under the conditions same as the normal use conditions.

Note that, in terms of performing the sealing characteristics investigation under the conditions same as the normal use conditions, when the configuration in which the end portion opening 812H faces the direction along the attachment surface 101P of the device housing 101 is adopted, the ventilation member 401 may not be provided with the flange portion 82. Moreover, in terms of performing the sealing characteristics investigation under the conditions same as the normal use conditions, when the configuration in which the end portion opening 812H faces the direction along the attachment surface 101P of the device housing 101 is adopted, there may be a mode in which the sealing member 50 is sandwiched between the support body 80 and the attachment surface 101P of the device housing 101 in the axial direction.

Note that, as shown in FIGS. 2A to 2C, for example, in the ventilation member 1 of the first exemplary embodiment, it may be sufficient to press the contacted portion 112 by the elastic jig 91 or the like, such as, by forming no asperities on the contacted portion 112; accordingly, for example, the contacted portion 112 may have a cone shape or an inverted cone shape to be gently inclined in the radial direction. This holds true in other exemplary embodiments or modified examples.

Moreover, for example, in the first exemplary embodiment, it is unnecessary that the entire ventilation membrane 20 is within the sealing member width region 30L of the sealing member 30 in the axial direction. For example, in the axial direction, when even at least a part of the ventilation membrane 20 falls inside the sealing member width region 30L, the thickness of the ventilation member 1 in the axial direction is reduced. This holds true in the relationship among other members or in other exemplary embodiments or modified examples.

REFERENCE SIGNS LIST

1 (201, 301, 401) Ventilation member
10 (40, 60, 80) Support body
13 Ventilation path
20 Ventilation membrane
30 (50, 70) Sealing member
31 Opening portion
91 Elastic jig
100 Vehicle lamp
101K Through hole
101P Attachment surface
111 End portion opening
112 Contacted portion
201 Ventilation member

The invention claimed is:

1. A ventilation member to be attached to a through hole of a housing, comprising:
   a main body comprising a ventilation path for a gas between an interior and an exterior of the housing;
   a seal that seals between the main body and the housing;
   a ventilation membrane that allows passage of the gas, but prevents passage of a liquid and a solid, through the ventilation path, wherein the ventilation path is bent in a radial direction after the ventilation membrane and continues to a plurality of end openings at the main body; and
   a surrounding portion that is in the main body and surrounds every end opening of the ventilation path, including the plurality of end openings, the surrounding portion having a uniform height.

2. The ventilation member according to claim 1, wherein the surrounding portion protrudes beyond the end opening.

3. The ventilation member according to claim 1, wherein the main body includes a connection portion that reduces load applied to the seal when the end opening is closed.

4. The ventilation member according to claim 1, wherein the plurality of end openings faces toward a direction that intersects an attachment surface in the housing for attaching the ventilation member.

5. The ventilation member according to claim 1, wherein the plurality of end openings faces toward a direction along an attachment surface in the housing for attaching the ventilation member.

6. The ventilation member according to claim 1, wherein the seal includes an opening inside the seal, and
   at least a part of the ventilation membrane is inside the opening.

7. The ventilation member according to claim 6, wherein the ventilation membrane is within a range of a width region of the seal in a direction that intersects an attachment surface of the housing for attaching the ventilation member.

8. The ventilation member according to claim 6, wherein the seal is within a range of a width region of the main body in a direction that intersects an attachment surface of the housing for the ventilation member.

9. The ventilation member according to claim 7, wherein the seal is within a range of a width region of the main body in a direction that intersects the attachment surface of the housing for the ventilation member.

\* \* \* \* \*